US012720903B1

(12) United States Patent
Shi et al.

(10) Patent No.: US 12,720,903 B1
(45) Date of Patent: Aug. 25, 2026

(54) INTEGRATED ACTIVE SILICON PHOTONIC DEVICES AND METHODS THEREOF

(71) Applicant: Aeluma, Inc., Goleta, CA (US)

(72) Inventors: Bei Shi, Goleta, CA (US); Bowen Song, Goleta, CA (US); Jonathan Klamkin, Goleta, CA (US)

(73) Assignee: Aeluma, Inc., Goleta, CA (US)

( * ) Notice: Subject to any disclaimer, the term of this patent is extended or adjusted under 35 U.S.C. 154(b) by 364 days.

(21) Appl. No.: 18/593,471

(22) Filed: Mar. 1, 2024

(51) Int. Cl.

| | |
|---|---|
| ***H10F 55/00*** | (2025.01) |
| ***H10F 71/00*** | (2025.01) |
| ***H10W 90/00*** | (2026.01) |

(52) U.S. Cl.
CPC ......... *H10F 55/18* (2025.01); *H10F 71/1276* (2025.01); *H10F 71/139* (2025.01); *H10W 90/00* (2026.01)

(58) Field of Classification Search
CPC .... H10F 55/18; H10F 71/1276; H10F 71/139; H10W 90/00; H10D 84/01; G02B 6/12004; G02B 6/1228
See application file for complete search history.

(56) References Cited

U.S. PATENT DOCUMENTS

2010/0330727 A1* 12/2010 Hill .......................... G02F 1/025 257/E31.127
2016/0103278 A1* 4/2016 Cheng .................. H10F 30/223 438/24
2016/0291269 A1* 10/2016 Klein ..................... G02B 6/423
2016/0327737 A1* 11/2016 Zhang ................ G02B 6/12002
2021/0271119 A1* 9/2021 Yu ......................... G02F 1/0157

* cited by examiner

*Primary Examiner* — Christine S. Kim
*Assistant Examiner* — Andrew Victor Prostor
(74) *Attorney, Agent, or Firm* — Ogawa P.C.

(57) ABSTRACT

Integrated systems including photonic integrated circuit (PIC) devices and methods of fabrication using selective area heteroepitaxy (SAH). The methods include forming a plurality of waveguide structures overlying a substrate, forming a cavity region between the waveguide structures, and forming a plurality of device materials within the cavity region such that an active region material of these device materials is aligned to at least a portion of the waveguide structures. The plurality of device materials can include compound semiconductor (CS) materials deposited by SAH, can be coupled to the waveguide structures or configured with an interface region in between, and can form an optical device, a laser device, or the like. Further, the resulting device can be integrated with other devices formed by SAH in separate cavity regions. The devices in the integrated system can be configured in a coupling scheme, such as a butt-coupling, directional coupling, or the like.

34 Claims, 41 Drawing Sheets

300

300
318
334
332
330
372
370
360
352
350
340
310

400
426
434
432
430
420
416
428
410

INTEGRATED ACTIVE SILICON PHOTONIC DEVICES AND METHODS THEREOF

CROSS-REFERENCES TO RELATED APPLICATIONS

N/A

BACKGROUND OF THE INVENTION

Electronic devices have proliferated over the years. From an iPhone 12 designed and sold by Apple Inc. to advanced networks for selling almost any type of good by Amazon.com Inc., electronic devices have entered into almost every aspect of our daily lives. These devices rely on miniature chips made from semiconductor materials, commonly silicon ("Si"). These silicon materials are also used to make sensing devices that can capture images of objects or scenes. Silicon is widely used because it is an abundant material and silicon-based semiconductor manufacturing is mature due to the investments made in the electronics industry. A common technology process is called complementary metal oxide semiconductor, or "CMOS." The CMOS technology was developed for manufacturing integrated circuits but is now used for image sensors and photodetectors. Such image sensors are called CMOS image sensors (CIS) and such photodetectors may be charge coupled devices (CCDs) or silicon single photon avalanche detectors (SPADs). Oftentimes, such CMOS sensors are manufactured using high-volume manufacturing with 8- and 12-inch silicon wafers. These image sensors and photodetectors are used for visible cameras and for near infrared (NIR) sensing. The latter form of these devices may be used for LiDAR scanning, facial recognition, proximity sensors, 3D imaging, and other applications. A common wavelength range for these sensors for such applications is about 900-940 nm.

Despite the advances with CMOS image sensors and photodetectors, limitations or drawbacks exist. For example, CMOS sensors have limitations in the detectable wavelength range. These CMOS sensors suffer from poor sensitivity at longer wavelengths within the detectable wavelength range. These and other limitations may also exist.

From the above, it is desired that the industry develops improved sensing devices.

BRIEF SUMMARY OF THE INVENTION

The present invention is generally related to electronic devices. More specifically, the present invention provides techniques related to optoelectronic devices such as, but not limited to, photonic integrated circuits (PICs) using heteroepitaxy of compound semiconductor ("CS") materials on silicon and other large-diameter substrates, along with subsequent circuit fabrication and integration methods. Merely by way of example, the present invention can be applied to various applications including image sensing, range finding, including LiDAR (light detection and ranging), among others, but it will be recognized that there are many other applications.

The present invention provides for methods and devices relating to photonic integrated circuits (PICs), such as lasers, photodetectors, modulators, and the like. The methods include forming a plurality of waveguide structures overlying a substrate, forming a cavity region between the waveguide structures, and forming a plurality of device materials within the cavity region such that an active region material of these device materials is aligned to at least a portion of the waveguide structures for light coupling. Depending on the application, the cavity region can extend into a portion of the substrate, the substrate can include a plurality of v-grooves, and the waveguide structures can include one or more device layers. Further, the plurality of device materials can include compound semiconductor (CS) materials deposited by selective area heteroepitaxy (SAH), can be coupled to the waveguide structures or configured with an interface region in between, and can form a laser, a photodetector, a modulator, or the like.

The present invention also provides for integrated systems including such PIC devices and related methods of fabrication. The methods include forming a waveguide structures within an insulating layer overlying a substrate, forming trench regions between these waveguide structures, forming buffer materials within each of the trench regions, and forming devices materials in each trench region using SAH such that the resulting devices (e.g., laser, modulator, semiconductor optical amplifier, photodetector, etc.) are configured in a coupling scheme (e.g., butt-coupling, directional coupling, etc.) with the waveguide structures. Thin insulating layers can be used with these trench regions in forming the devices such that only one trench region is exposed at a time to form the target device. Afterwards, a planarized insulating layer can be formed overlying all of the devices in preparation for subsequent processes.

Benefits or advantages are achieved over conventional techniques. The integration platform based on heteroepitaxy of CS materials and device structures on Si by direct or selective heteroepitaxy enables large-volume manufacturing of optoelectronic devices, such as image sensor and laser arrays. These and other benefits or advantages are described throughout the present specification and more particularly below.

A further understanding of the nature and advantages of the invention may be realized by reference to the latter portions of the specification and attached drawings.

BRIEF DESCRIPTION OF THE DRAWINGS

In order to better understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF THE INVENTION

Figure 1A:
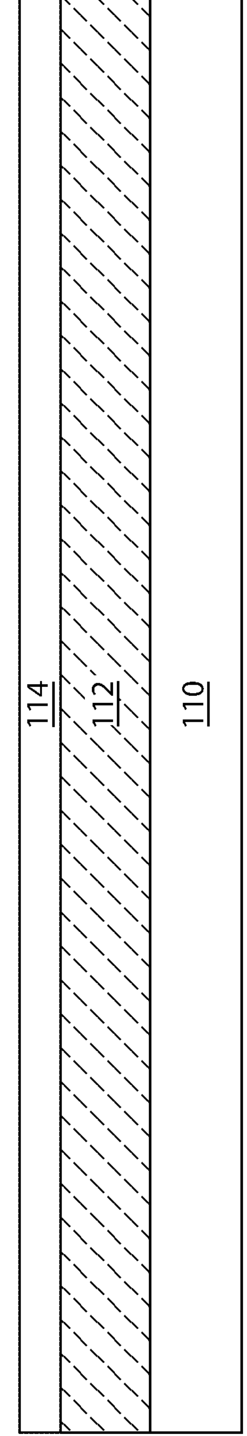
FIG. 1A to FIG. 1G are simplified diagrams illustrating cross-sectional views of a method of fabricating an active photonic device with embedded waveguides according to an example of the present invention.

The present invention is generally related to photonic devices. More specifically, the present invention provides techniques related to optoelectronic devices for mobile applications such as, but not limited to, photonic integrated circuits (PICs) using heteroepitaxy of CS materials on Si and other large-diameter substrates, along with subsequent circuit fabrication and integration methods. Merely by way of example, the present invention can be applied to various applications including optical communications, image sensing, range finding, LiDAR, quantum computing, among others, but it will be recognized that there are many other applications.

In an example, the present invention provides method and device for realizing highly manufacturable and scalable semiconductor optoelectronic devices, including lasers, on Si substrates that can be implemented in a variety of module devices. By directly depositing CS materials on Si substrates, mature Si microelectronics manufacturing processes can be leveraged to fabricate high performance silicon photonic integrated lasers. Deposition on 8- and 12-inch Si substrates, which are common for CMOS technologies, enables the subsequent fabrication in CMOS manufacturing lines, however, the technology is not limited to 8- and 12-inch Si substrates only. CS materials can be deposited directly onto Si substrates with the techniques described in the present invention.

The technique to describe the direct deposition of CS materials is referred to herein as selective area heteroepitaxy. The selective area heteroepitaxy step or steps may be carried out with techniques including, but not limited to, metalorganic chemical vapor deposition (MOCVD), molecular beam epitaxy (MBE), metalorganic MBE (MOMBE), chemical beam epitaxy (CBE), hydride vapor phase epitaxy (HVPE), liquid phase epitaxy (LPE), or any combination thereof.

In addition to Si substrates, alternative substrates may be used including, but not limited to, standard silicon on insulator (SOI), miscut Si, SOI on miscut Si, germanium (Ge) on Si, Ge, miscut Ge, or compound semiconductor substrates including gallium arsenide (GaAs) and indium phosphide (InP) substrates, without departing from the scope of the invention.

In an embodiment of the present invention, CS material is deposited onto a Si substrate by selective area heteroepitaxy, by firstly depositing a buffer material that includes an initial nucleation on the Si surface and enables the trapping, annihilation, and/or filtering of defects near the interface between the CS material and the Si surface. The initial nucleation step may be carried out at a relatively low temperature, and the subsequent buffer material growth intended to trap, annihilate and/or filter defects may be carried out at a higher temperature. Surface treatment may be carried out prior to the initial nucleation on the Si surface. This treatment may include, but is not limited to, chemical cleaning and/or treatment of the Si surface, reordering of the Si surface with high-temperature annealing in an ambient, high-temperature annealing in an ambient to remove and/or treat a surface oxide, or the formation of various Si crystal planes by treatment or etching.

The initial nucleation and buffer growth can be carried out with a number of methodologies, and combinations of methodologies, including, but not limited to, initial group IV (e.g., Si or Ge material) growth for surface reordering or reparation followed by CS growth for defect trapping, or Si surface patterning or structuring, that may include formation of various Si crystal planes, followed by CS nucleation and growth, or low-temperature CS nucleation, or low-temperature CS nucleation followed by multi-step growth with temperature grading for defect bending and annihilation, or use of strained layer superlattices (SLSs), interfaces with high strain fields, graded or step-graded layers, or other similar techniques to redirect, trap, convert, and/or annihilate defects.

The techniques of the present invention can be used to manufacture various optoelectronic devices in high volumes by leveraging Si manufacturing methods. These devices include, but are not limited to, lasers that are either edge-emitting or vertical cavity surface emitting, optical modulators, photodetectors or photodiodes, semiconductor optical amplifiers, and nonlinear photonic devices for optical frequency comb generation. Specific to optical communications and lasers, various device structures can be realized by heteroepitaxy deposition of device layers and subsequent fabrication steps. The device structures include, but are not limited to, on-chip Fabry-Perot (FP) broad area lasers, ridge lasers, distributed-feedback (DFB) lasers, distributed Bragg reflector (DBR) lasers, micro-ring and disk lasers, and external cavity lasers (ECLs). Specific to image sensors and photodetector circuit arrays, various device structures could be realized by heteroepitaxy deposition of device layers and subsequent fabrication steps. These device structures include, but are not limited to, planar photodiodes, mesa photodiodes, double mesa photodiodes, PIN or NIP photodiodes, avalanche photodiodes (APDs), charge coupled devices (CCDs), focal plane array (FPA) devices, single photon avalanche detectors (SPADs), and uni-traveling-carrier (UTC) photodiodes.

The optoelectronic devices and device arrays realized with deposition of CS materials on Si can be leveraged in various applications, including, but not limited to, datacom, telecom, and free space communications; Quantum photonic integrated circuits and quantum computing; LiDAR for autonomous vehicles including, but not limited to, automobiles, aerial vehicles, airplanes, jets, drones, robotic vehicles; advanced driver assistance systems (ADAS); LiDAR for mobile devices including, but not limited to, phones and tablets; imaging for camera applications including, but not limited to, digital cameras, mobile phones, tablets; imaging and perception for robots, artificial intelligence (AI) applications, augmented reality (AR) applications, and virtual reality (VR) applications; 3D imaging and sensing; defense and aerospace; industrial vision, factory automation; medical and biomedical imaging; topography, weather, and wind mapping; gas sensing; infrared (IR) and near infrared (NIR) imaging and sensing; smart building, security, people counting; proximity sensing; facial recognition, thermal imaging, thermography; heating, ventilation and air conditioning (HVAC);

In addition to the group III-V CS materials, the techniques of the present invention could apply to other materials for photodetector circuits including, but not limited to, II-VI compounds, IV-VI compounds, II-V compounds, or IV-IV compounds.

In another embodiment, the CS nucleation, buffer materials and subsequent photodetector materials may be deposited and formed by selective area heteroepitaxy, whereby the Si or similar substrate could be first patterned with a dielectric to form recesses, within which the CS nucleation, the buffer materials and the photodetector materials could be selectively deposited. Selective area heteroepitaxy is the process by which the Si substrate would be patterned with a dielectric, and the subsequent deposition of semiconductor materials would deposit selectively on the exposed Si surfaces but not on the dielectric surfaces. Selective area heteroepitaxy is beneficial for improving the quality of the CS material on Si, for facilitating photodetector fabrication, and also for realization of novel device structures. Selective area heteroepitaxy can improve material quality by releasing thermal strain caused by the mismatch in thermal expansion coefficient between the CS materials and the Si, and by providing aspect ratio trapping of defects and dislocations.

FIG. 1A to FIG. 1G are simplified diagrams illustrating cross-sectional views of a method of fabricating a photonic integrated circuit (IC) device with embedded waveguides according to an example of the present invention. In these figures, shared reference numerals in subsequent figures refer to the same elements as described in previous figures. Further, these figures describe a process of laser integration on a standard silicon-on-insulator (SOI) wafer with silicon (Si) waveguides embedded that leverages III-V on Si selective area heteroepitaxy (SAH). However, those of ordinary skill in the art will recognize other variations, modifications, and alternatives to this method and resulting device configuration.

In FIG. 1A, the method for fabricating the active photonic device 100 starts with a substrate (e.g., silicon substrate, silicon nitride template substrate, or the like) 110 with a first insulating layer (e.g., oxide material, silicon nitride material, or other dielectric material, and the like) 112 formed overlying the substrate 110 and a device layer 114 overlying the first insulating layer 112. In a specific example, this method starts with a silicon-on-insulator (SOI) wafer with a silicon (Si) device layer and Si substrate, both of which can include offcut Si.

Figure 1B:
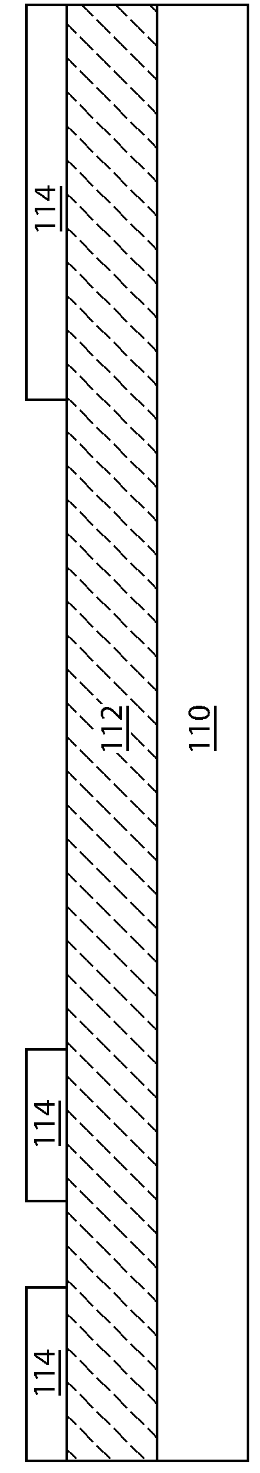

In FIG. 1B, the method includes removing one or more portions of the device layer 114 to form a plurality of waveguide structures, which can vary in size and position depending on the application. The removal processes discussed herein can include a lithography process or other patterning/etching processes, and the like. The resulting waveguide structures are configured for waveguide coupling in the resulting device. Here, two remaining portions of the device layer 114 are configured as waveguide structures on the left side, while a larger remaining portion of device layer 114 is configured as a waveguide structure on the right side.

Figure 1C:
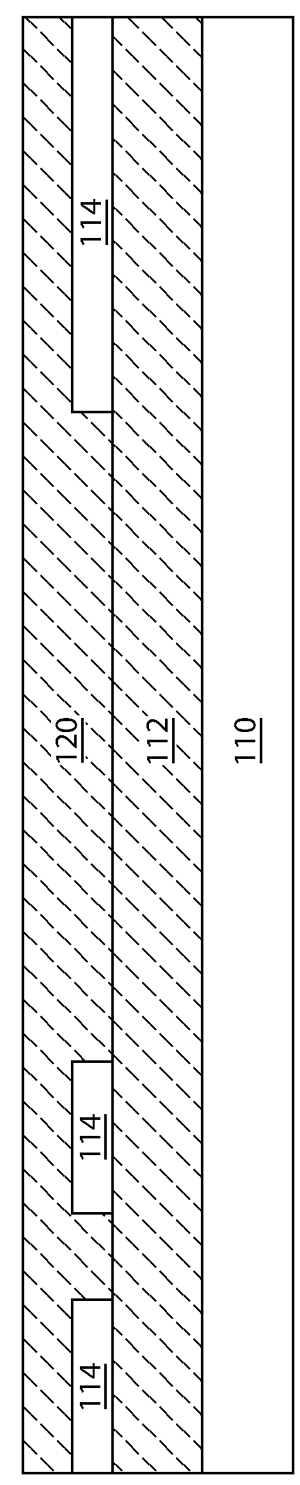

In FIG. 1C, the method includes forming a second dielectric layer 120 (e.g., oxide material, silicon nitride material, or other dielectric material, and the like) overlying the first dielectric layer 112 and the remaining portions of the device layer 114 configured as waveguide structures. The method can also include a subsequent planarizing process, such as chemical mechanical polishing (CMP), or the like.

Figure 1D:
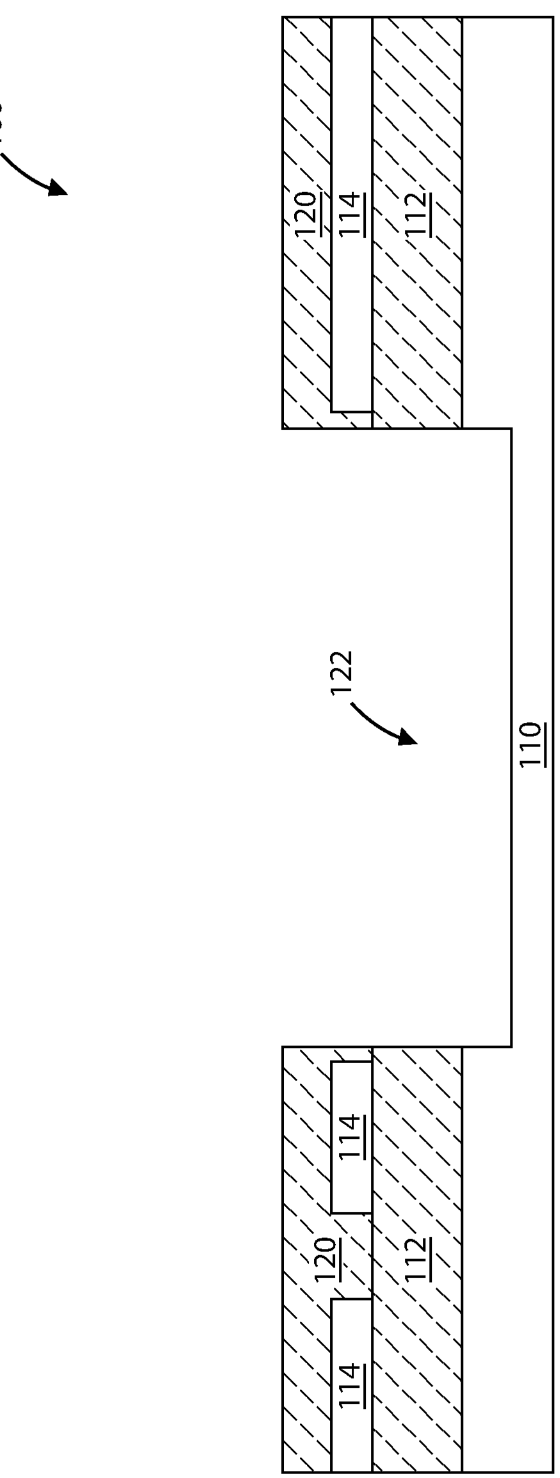

In FIG. 1D, the method includes removing one or more portions of the second dielectric layer 120, the first insulating layer 112, and the substrate 110 to form a cavity region 122. Here, the cavity region 122 is configured between the waveguide structures and extends through the first and second insulating layers 112, 120 and into a portion of the substrate 110.

Figure 1E:
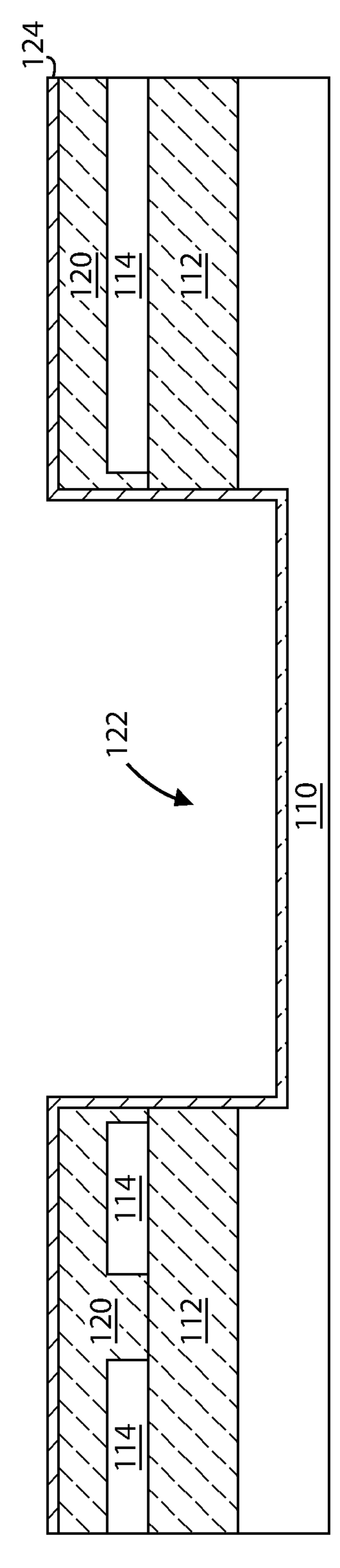
Figure 1F:
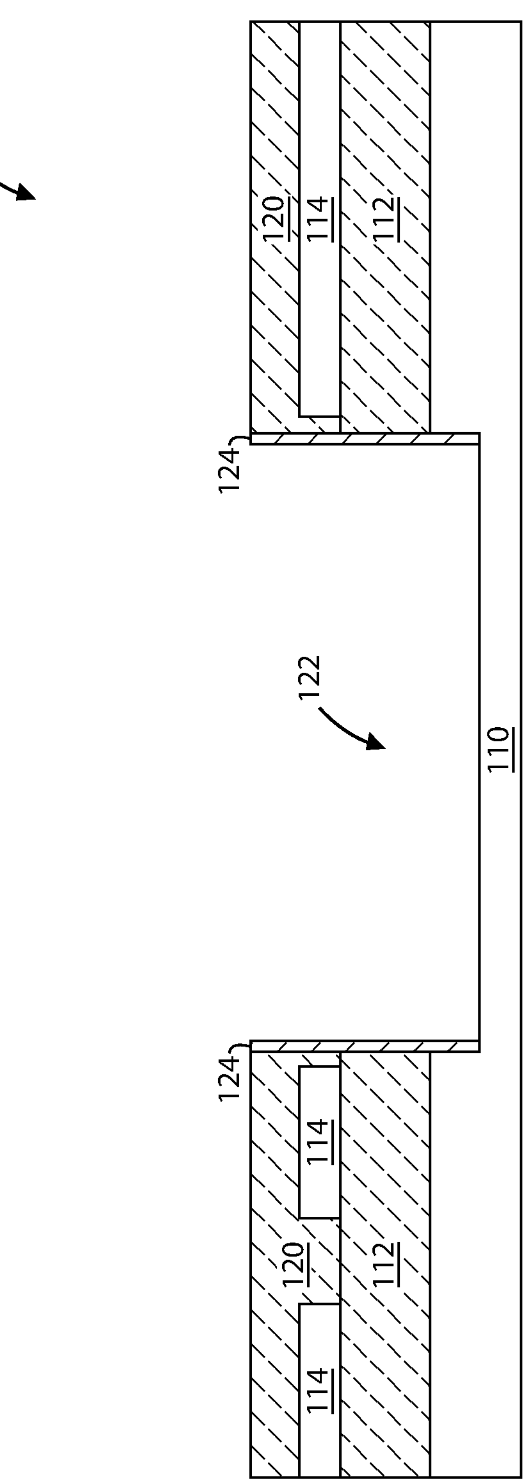

In FIG. 1E, the method includes forming a thin conformal insulating layer 124 (e.g., oxide material, silicon nitride material, or other dielectric material, and the like) overlying the second insulating layer 120 and the cavity region 122. Then, in FIG. 1F, the method includes removing one or more portions of the thin conformal insulating layer 124 to form a sidewall encapsulation structure within the cavity region 122. Here, the remaining portions of the thin conformal insulating layer 124 form the sidewall encapsulation with the substrate 110 being exposed. The method can also include subsequent surface preparation process, which can suppress or eliminate the formation of antiphase boundaries (APBs) or antiphase domains (APDs). Such processes can include thermal treatment, utilizing an offcut Si process, surface roughening process, surface reordering process, or the like.

Figure 1G:
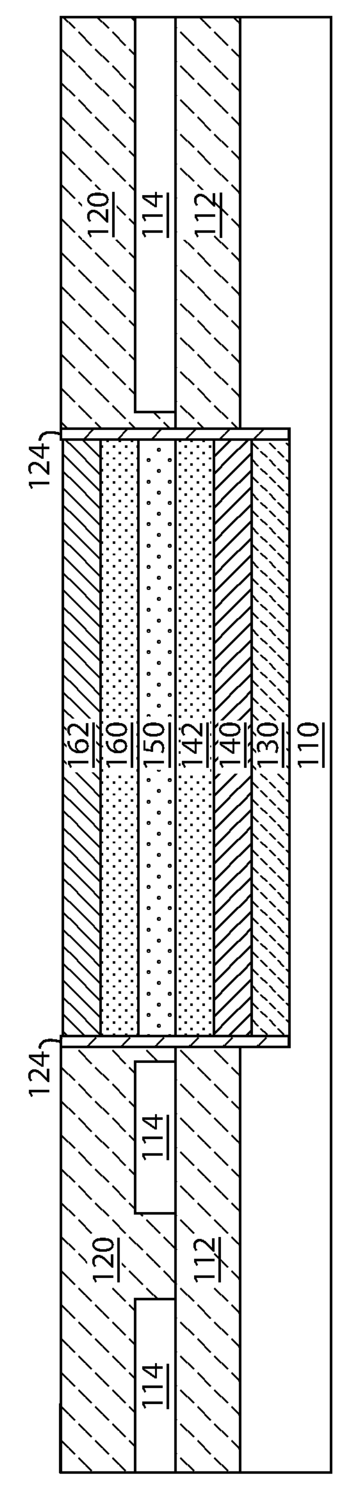

In FIG. 1G, the method includes forming a plurality of device layers within the cavity region 122. Here, the layers, from bottom to top, include a buffer material 130, an n-type contact material 140, an n-type lower cladding material 142, an active material 150, a p-type upper cladding material 160, and a p-type contact material 162. In a specific example, these materials can be deposited using a SAH process to form a laser device (e.g., III-V laser, or the like). The active material 150 can include a quantum well (QW) material, a quantum dot (QD) material, a quantum dash (QDash) material, or the like. Further, the active material 150 is spatially configured such that at least a portion of the active material 150 is aligned to the waveguide structures. The gap between the device layers and the waveguide structures can be controlled during the previous process steps, such as during the formation of the waveguide structure and the cavity region 122.

In an example, the buffer material 130 can include a CS material deposited on the surface region of the substrate 110 using direct heteroepitaxy such that the CS material is characterized by a first bandgap characteristic, a first thermal characteristic, a first polarity, and a first crystalline characteristic. Compared to the buffer material 130, the substrate 110 is characterized by a second bandgap characteristic, a second thermal characteristic, a second polarity, and a second crystalline characteristic.

In a specific example, the CS materials can include indium phosphide (InP), indium gallium arsenide (InGaAs), gallium arsenide (GaAs), gallium phosphide (GaP), indium gallium arsenide phosphide (InGaAsP), indium aluminum gallium arsenide (InAlGaAs), indium aluminum arsenide (InAlAs), indium arsenide (InAs), indium gallium phosphide (InGaP), or a combination thereof.

The n-type and p-type contact materials can also the CS materials discussed previously. In a specific example, the n-type contact material can include an InP material with a silicon impurity having a concentration ranging from 1E18 $cm^{-3}$ to 5E18 $cm^{-3}$ overlying the buffer material. The absorption material can include an InGaAs containing material and can be primarily (or substantially) free from any impurity. And, the p-type contact material can include a zinc impurity or a beryllium impurity having a concentration ranging from 1E18 $cm^{-3}$ to 1E20 $cm^{-3}$.

In an alternative photodetector CS device structure, the n-type contact material includes a GaAs material comprising a silicon dopant having a concentration ranging from 1E18 $cm^{-3}$ to 5E18 $cm^{-3}$, the absorption material includes an InAs quantum dot material, and the p-type contact material includes a zinc impurity or a beryllium dopant or a carbon dopant having a concentration ranging from 1E18 $cm^{-3}$ to 1E20 $cm^{-3}$.

Additionally, the avalanche photodetector device structure can be configured with a separate absorption material comprising InGaAs, InAlGaAs, or InGaAsP, and a multiplication material comprising InP whereby the multiplication material generates additional charge carriers by avalanche gain.

In an example, the plurality of device materials is formed such that one or more of the plurality of waveguide structures are coupled to the plurality of device materials. Or, the cavity region is formed such that the formation of the plurality of device materials results in an interface region being configured between at least one of the plurality of waveguide structures and the plurality of device materials, the interface region being at least a portion of the first insulating layer or the second insulating layer.

Figure 2:
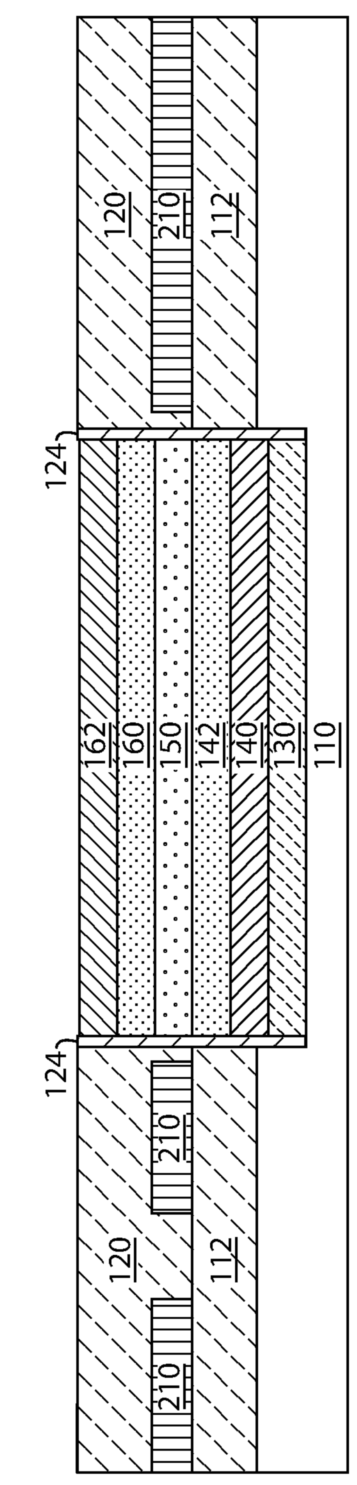
FIG. 2 is a simplified diagram illustrating a cross-sectional view of an active photonic device according to an example of the present invention.

FIG. 2 is a simplified diagram illustrating a cross-sectional view of an active photonic device according to an example of the present invention. As discussed previously, shared reference numerals refer to the same elements as described in previous figures. As shown, device 200 is similar to device 100, except that the previous waveguide structures are replaced with alternative waveguide structures 210. In a specific example, these waveguide structures 210 can include different waveguide materials, such as a silicon nitride ($SiN_x$) material, or other compound materials, and the like.

In an example, the method for forming the alternative waveguide structures can start with other substrate types (e.g., silica, nonlinear crystal materials, or the like), and the device layer used to form the waveguide structures 210 can be formed overlying the alternative substrate at a desired height and spacing to be aligned with the active layer 150. One or more insulating layers can be formed overlying the alternative substrate to calibrate the height of the waveguide structures 210. Of course, there can be other variations, modifications, and alternatives.

FIG. 3A to FIG. 3H are simplified diagrams illustrating cross-sectional views of a method of fabricating an active photonic device with embedded multi-layer waveguides and according to an example of the present invention. In these figures, shared reference numerals in subsequent figures refer to the same elements as described in previous figures. Further, these figures describe a process of laser integration on a standard silicon-on-insulator (SOI) wafer with silicon (Si) waveguides embedded that leverages III-V on Si selective area heteroepitaxy (SAH). However, those of ordinary skill in the art will recognize other variations, modifications, and alternatives to this method and resulting device configuration.

Figure 3A:
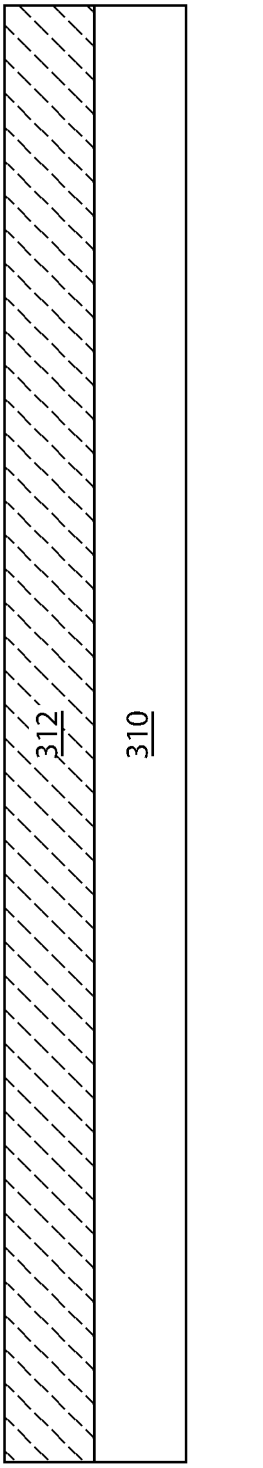
FIG. 3A to FIG. 3H are simplified diagrams illustrating cross-sectional views of a method of fabricating an active photonic device with embedded multi-layer waveguides and according to an example of the present invention.
Figure 3B:
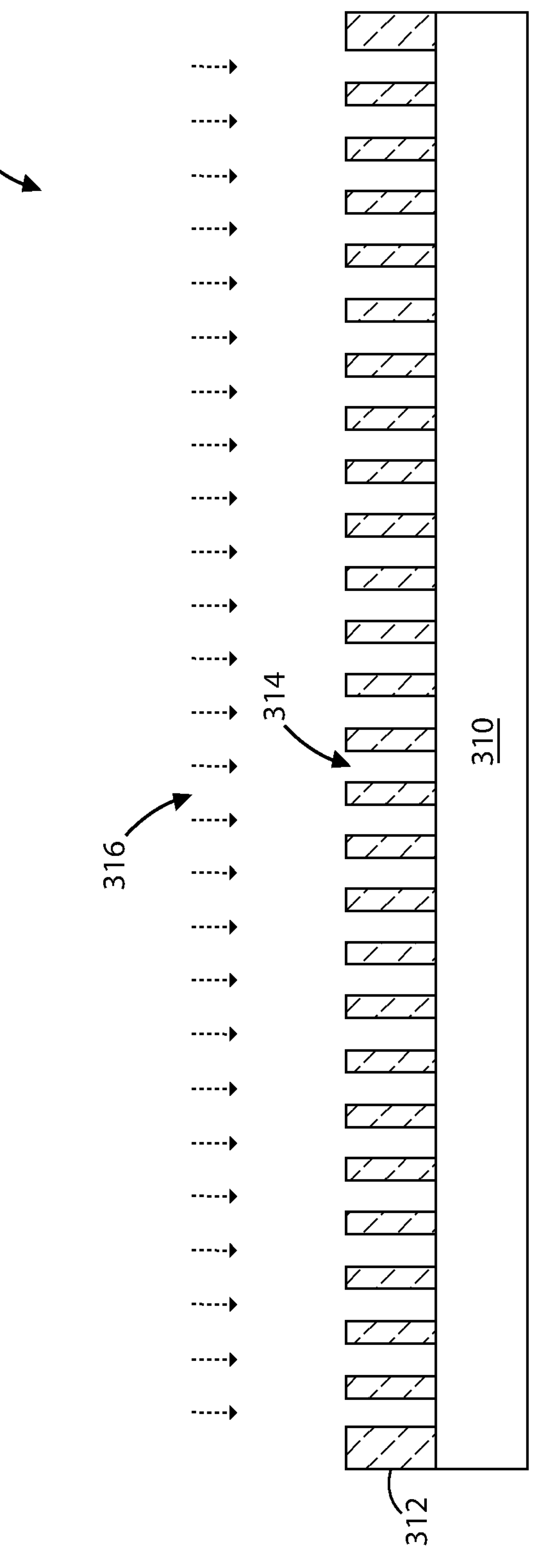

In FIG. 3A, the method for fabricating the active photonic device 300 starts with a substrate (e.g., silicon substrate, or the like) 310 with a first insulating layer (e.g., oxide material, silicon nitride material, or other dielectric material, and the like) 312 formed overlying the substrate 310. And, in FIG. 3B, the method includes removing a plurality of portions from the first insulating layer 312 to form a plurality of small trench openings 314, each of which exposes a portion of the substrate 310. Further, the method includes performing an etching process 316 to form a plurality of v-grooves 318 (see FIG. 3C) (e.g., by selective wet etching, or the like) within the substrate 310 using the plurality of trenches 314.

Figure 3C:
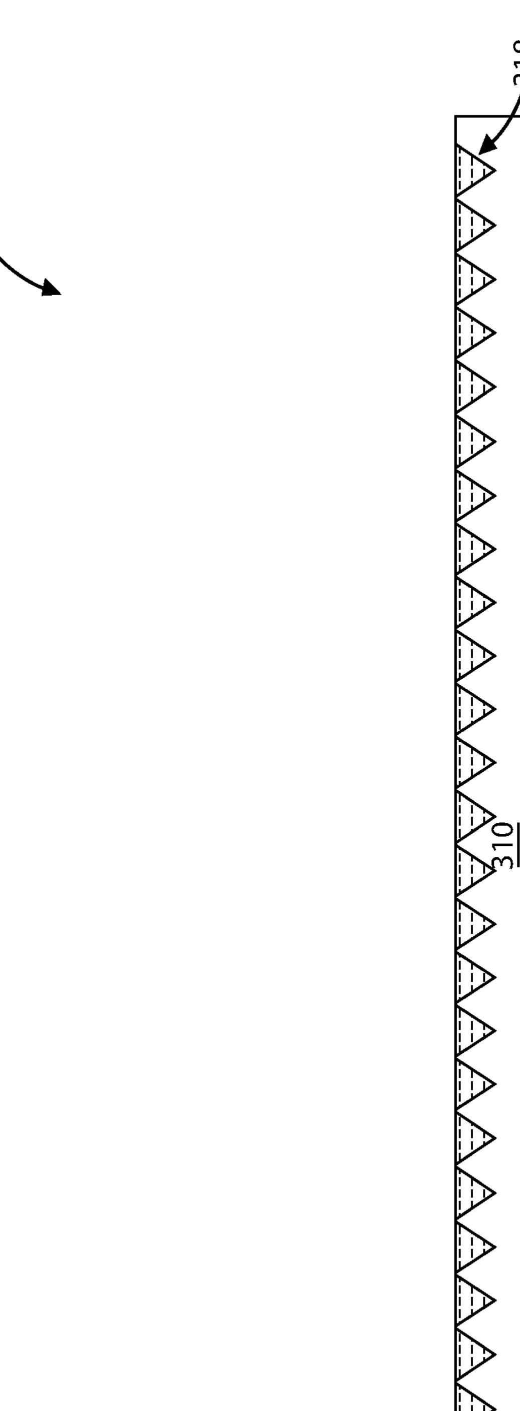
Figure 3C:

In FIG. 3C, the method includes removing the first insulating layer 312, which leaves the substrate 310 with the plurality of v-grooves 318. In a specific example, each of these v-grooves 318 can have a feature size of 30 to 500 nm in width, and each of these v-grooves can expose {111} crystalline planes of the substrate.

Figure 3D:
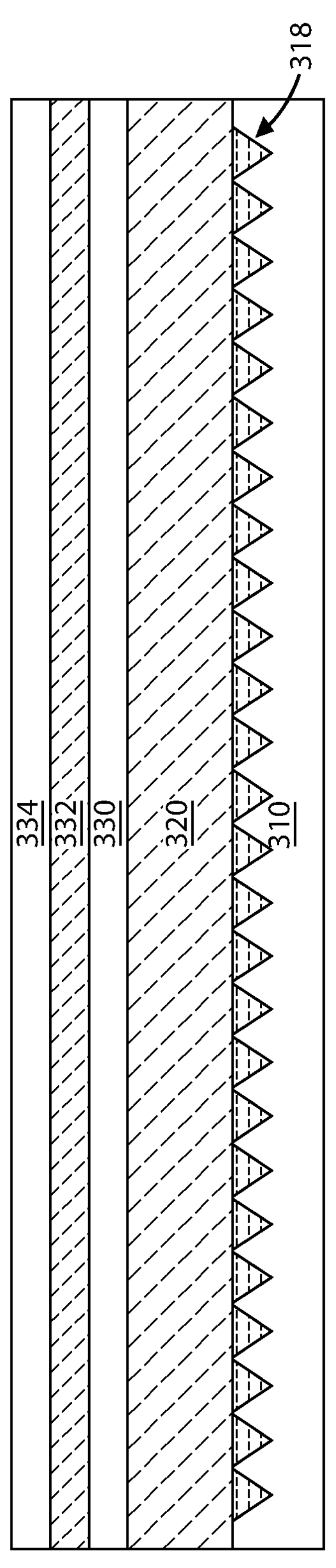

In FIG. 3D, the method includes forming a second insulating layer 320 overlying the substrate 310 with the plurality of v-grooves 318, and forming a multi-layer device stack overlying the second insulating layer 320 (e.g., oxide material, or other dielectric material, and the like). This multi-layer device stack includes at least a first device layer 330 (e.g., silicon materials, silicon compound materials, and the like) overlying the second insulating layer 320, a first cladding layer 332 (e.g., oxide material, low-K dielectric, and the like) overlying the first device layer 330, and a second device layer 334 (e.g., silicon materials, silicon compound materials, and the like) overlying the cladding layer 332. Depending on the application, the multi-layer device stack can include additional device layers separated by additional cladding layers. In a specific example, the device layers are $SiN_x$ device layers, and the cladding layers are $SiO_2$ layers.

Figure 3E:
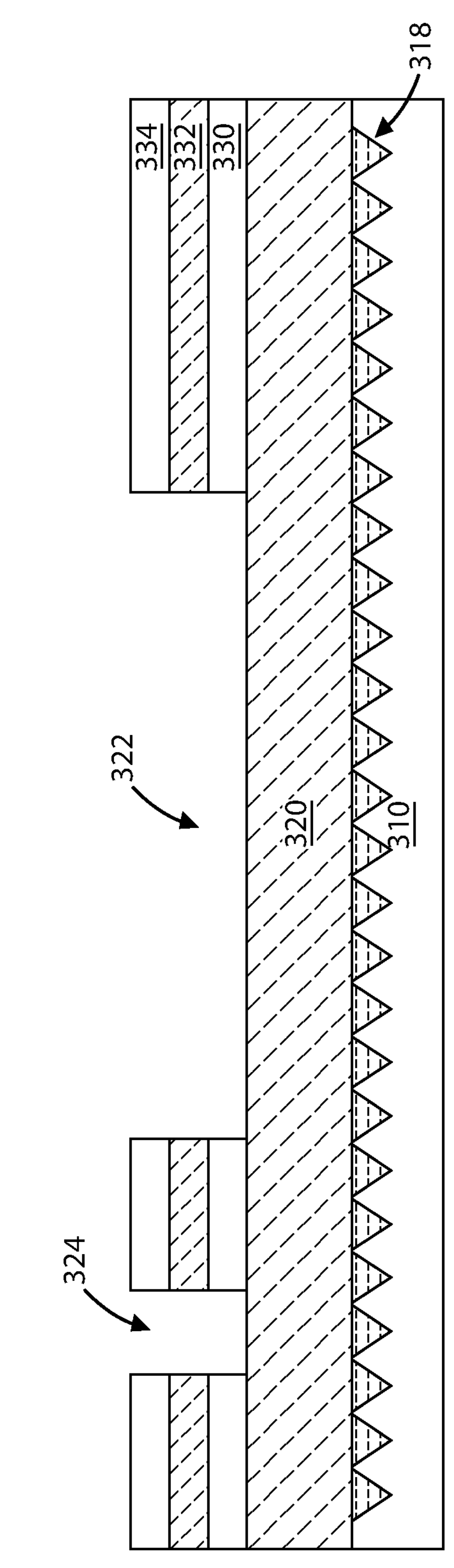

In FIG. 3E, the method includes removing one or more portions of the first and second device layers 330, 334 and of the cladding layer 332 to form a plurality of waveguide structures, which can vary in size and position depending on the application. The removal process can include a patterning process, or the like, and the resulting waveguide structures are configured for waveguide coupling in the resulting device. Here, two remaining portions of the device layer stack (separated by cavity region 324) are configured as waveguide structures on the left side, while a larger remaining portion of device layer stack (separated from other waveguide structures by cavity region 322) is configured as a waveguide structure on the right side.

Figure 3F:
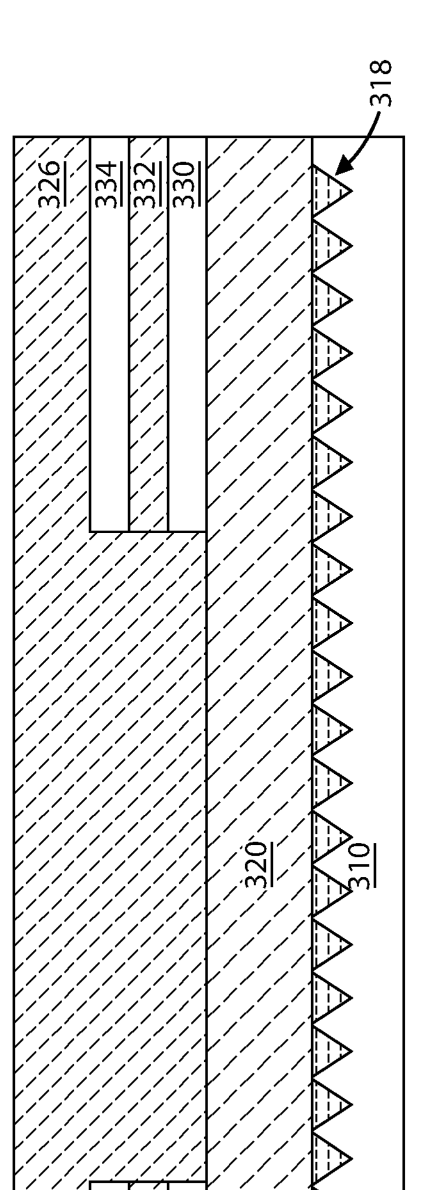

In FIG. 3F, the method includes forming a third insulating layer 326 (e.g., oxide material, or other dielectric material, and the like) overlying the second insulating layer 320 and the remaining portions of the device layer stack (device layers 330, 334 and cladding layer 332) configured as waveguide structures. The method can also include a subsequent planarizing process, such as chemical mechanical polishing (CMP), or the like.

Figure 3G:
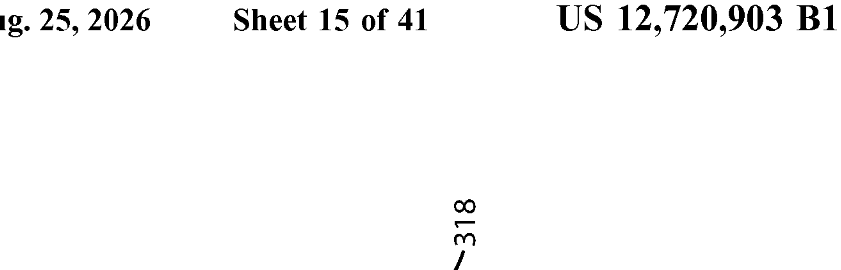
Figure 3G:
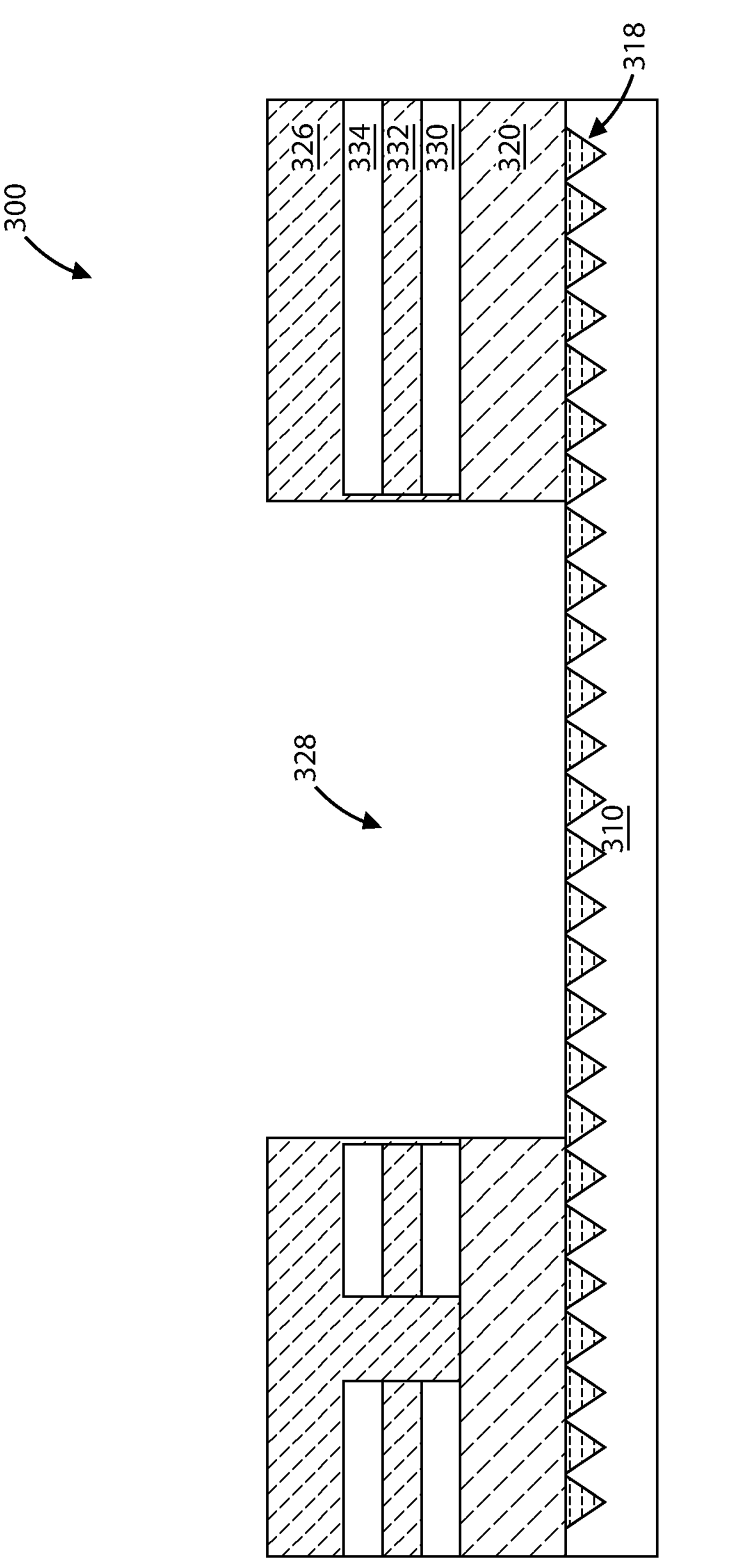

In FIG. 3G, the method includes removing one or more portions of the third insulating layer 326 and the second insulating layer 320 to form a cavity region 328. Here, the cavity region 328 is configured between the waveguide structures and extends through the second and third insulating layers 320, 326 and exposes the substrate 310. The method can also include subsequent surface preparation process, which can suppress or eliminate the formation of antiphase boundaries (APBs) or antiphase domains (APDs). Such processes can include an offcut Si process, surface roughening process, surface reordering process, or the like.

Figure 3H:
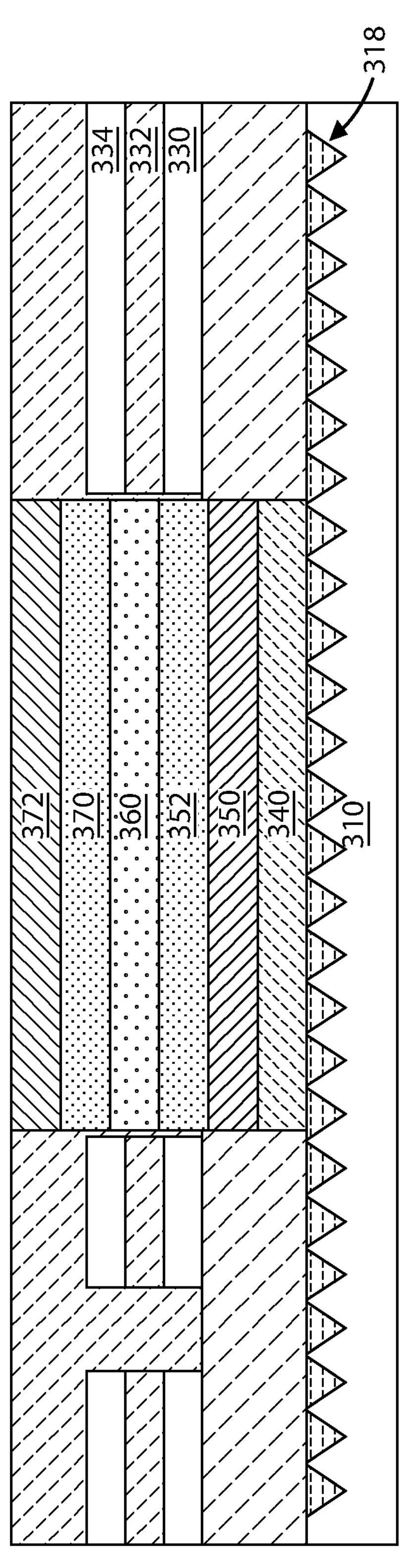

In FIG. 3H, the method includes forming a plurality of device materials within the cavity region 328. Here, the materials, from bottom to top, include a buffer material 340, an n-type contact material 350, an n-type lower cladding material 352, an active material 360, a p-type upper cladding material 370, and a p-type contact material 372. In a specific example, these materials can be deposited using a SAH process to form an optical device or a laser device (e.g., III-V laser, or the like). The active material 360 can include a quantum well (QW) material, a quantum dot (QD) material, a quantum dash (QDash) material, or the like. Further, the active material 360 is spatially configured such that at least a portion of the active material 360 is aligned to the waveguide structures. The gap between the device layers and the waveguide structures can be controlled during the previous process steps, such as during the formation of the waveguide structure and the cavity region 328. These components can include similar materials and configurations discussed previously.

In an example, the buffer material 340 can include a plurality of nanowires formed overlying each of the plurality of grooves and extending along a length of each of the v-grooves. The buffer material 340 can include a first transitionary region extending from each of the plurality of nanowires, and a second transitionary region characterized by a {100}-oriented crystalline planar growth of a gallium arsenide compound semiconductor (CS) material configured using a direct heteroepitaxy such that the CS material is characterized by a first bandgap characteristic, a first thermal characteristic, a first polarity, and a first crystalline characteristic, and the substrate 310 is characterized by a second bandgap characteristic, a second thermal characteristic, a second polarity, and a second crystalline characteristic. These components can include similar materials and configurations discussed previously.

In an example, the buffer material 340 further includes a gallium arsenide containing material and an indium phosphide containing transitionary region (e.g., InGaAs, or the like) and an interface region comprising a trapping layer comprising indium gallium arsenide and indium phosphide overlying the gallium arsenide containing material and indium phosphide containing transitionary region. In a specific example, the transitionary region can be closer to GaAs at the start and can be closer to InP towards an InP graded region.

FIG. 4A to FIG. 4G are simplified diagrams illustrating cross-sectional views of a method of fabricating an active photonic device with embedded multi-layer waveguides and according to an example of the present invention. In these figures, shared reference numerals in subsequent figures refer to the same elements as described in previous figures. Further, these figures describe a process of laser integration on a standard silicon-on-insulator (SOI) wafer with silicon (Si) waveguides embedded that leverages III-V on Si selective area heteroepitaxy (SAH). However, those of ordinary skill in the art will recognize other variations, modifications, and alternatives to this method and resulting device configuration.

Figure 4A:
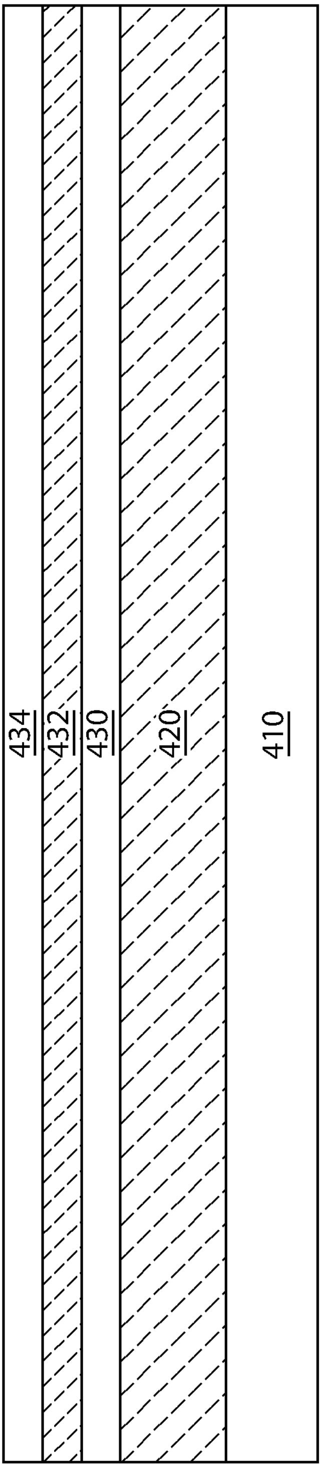
FIG. 4A to FIG. 4G are simplified diagrams illustrating cross-sectional views of a method of fabricating an active photonic device with embedded multi-layer waveguides and according to an example of the present invention.

In FIG. 4A, the method for fabricating the photonic IC device 400 starts with a substrate (e.g., silicon substrate, or the like) 410 with a first insulating layer (e.g., oxide material, or other dielectric material, and the like) 420 formed overlying the substrate 410 and a multi-layer device stack overlying the first insulating layer 420. This multi-layer device stack includes at least a first device layer 430 (e.g., silicon materials, silicon compound materials, and the like) overlying the first insulating layer 420, a first cladding layer 432 (e.g., oxide material, or other dielectric material, and the like) overlying the first device layer 430, and a second device layer 434 (e.g., silicon materials, silicon compound materials, and the like) overlying the cladding layer 432. Depending on the application, the multi-layer device stack can include additional device layers separated by additional cladding layers. In a specific example, the device layers are $SiN_x$ device layers, and the cladding layers are $SiO_2$ layers.

Figure 4B:
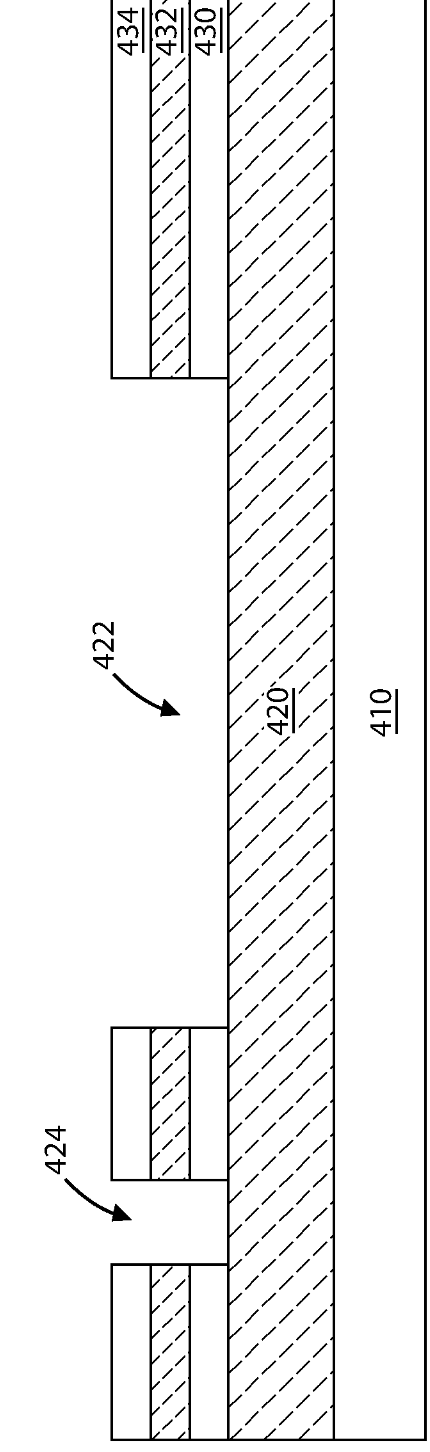

In FIG. 4B, the method includes removing one or more portions of the first and second device layers 430, 434 and of the cladding layer 432 to form a plurality of waveguide structures, which can vary in size and position depending on the application. The removal process can include a patterning process, or the like, and the resulting waveguide structures are configured for waveguide coupling in the resulting device. Here, two remaining portions of the device layer stack (separated by cavity region 424) are configured as waveguide structures on the left side, while a larger remaining portion of device layer stack (separated from other waveguide structures by cavity region 422) is configured as a waveguide structure on the right side.

Figure 4C:
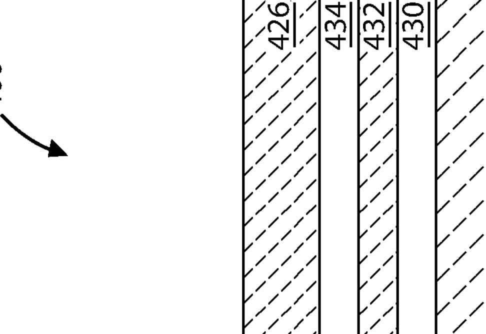
Figure 4C:

In FIG. 4C, the method includes forming a second insulating layer 426 (e.g., oxide material, or other dielectric material, and the like) overlying the first insulating layer 420 and the remaining portions of the device layer stack (device layers 430, 434 and cladding layer 432) configured as waveguide structures. The method can also include a subsequent planarizing process, such as chemical mechanical polishing (CMP), or the like.

Figure 4D:
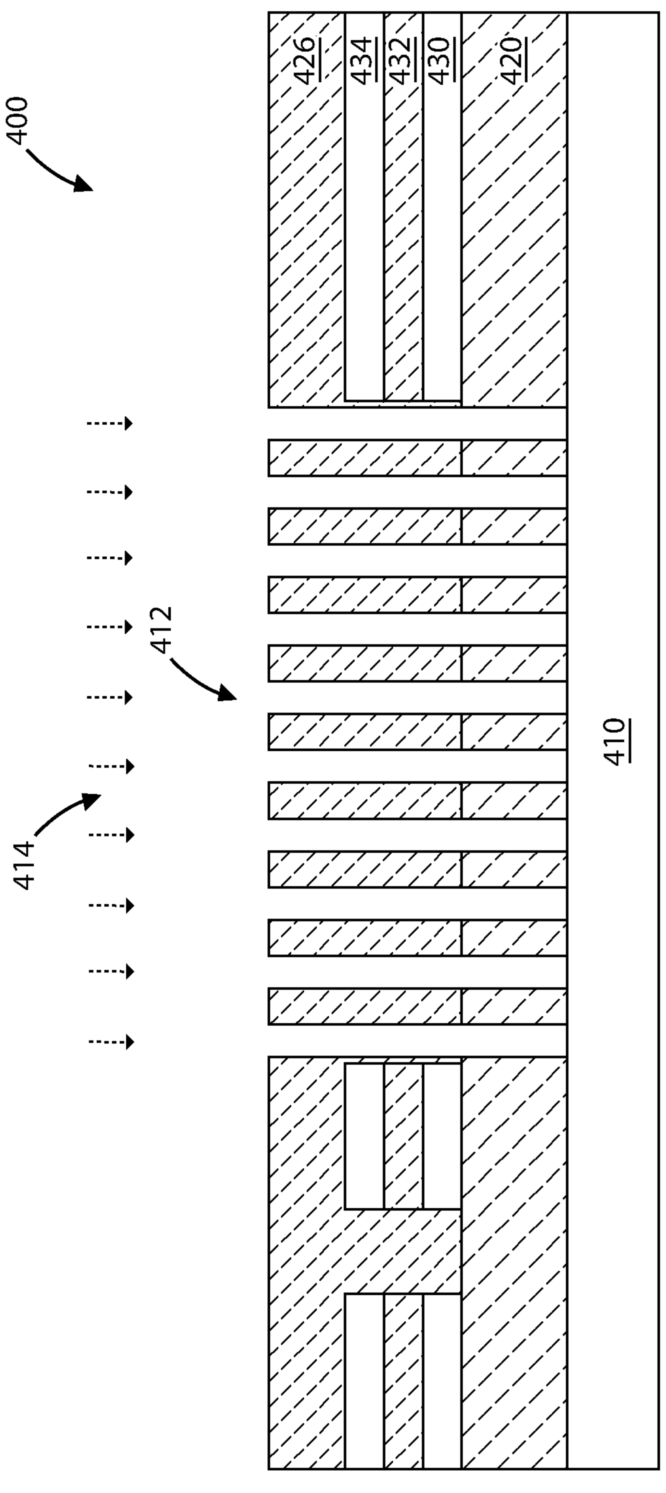
Figure 4E:
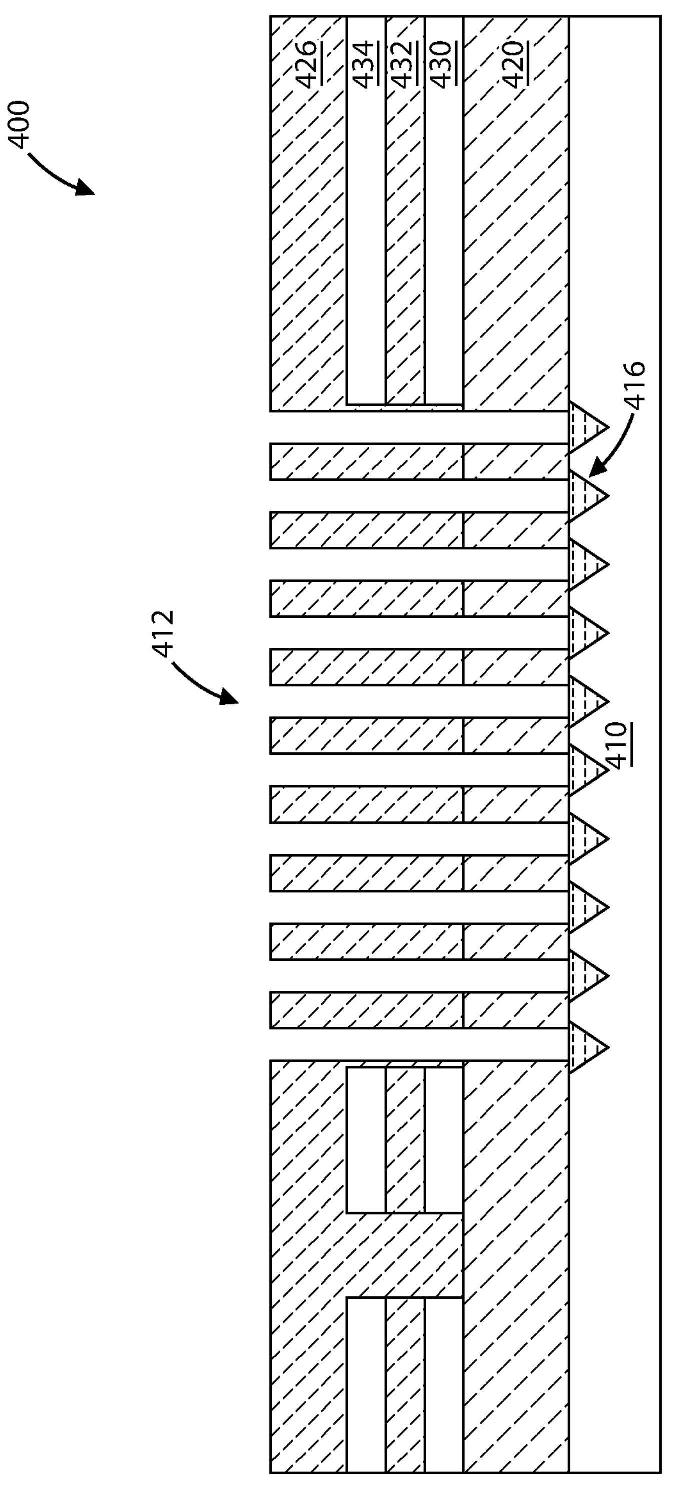

In FIG. 4D, the method includes removing a plurality of portions of the second insulating layer 426 and the first insulating layer 420 to form a plurality of trenches 412, each of which exposes a portion of the substrate 410. Further, the method includes performing an etching process 414 (e.g., high aspect ratio etching, or the like) to form a plurality of v-grooves 416 (see FIG. 4E) using the plurality of trenches 412. As discussed previously, each of these v-grooves 416 can have a feature size of 30 to 500 nm in width, and each of these v-grooves can expose {111} crystalline planes of the substrate.

Figure 4F:
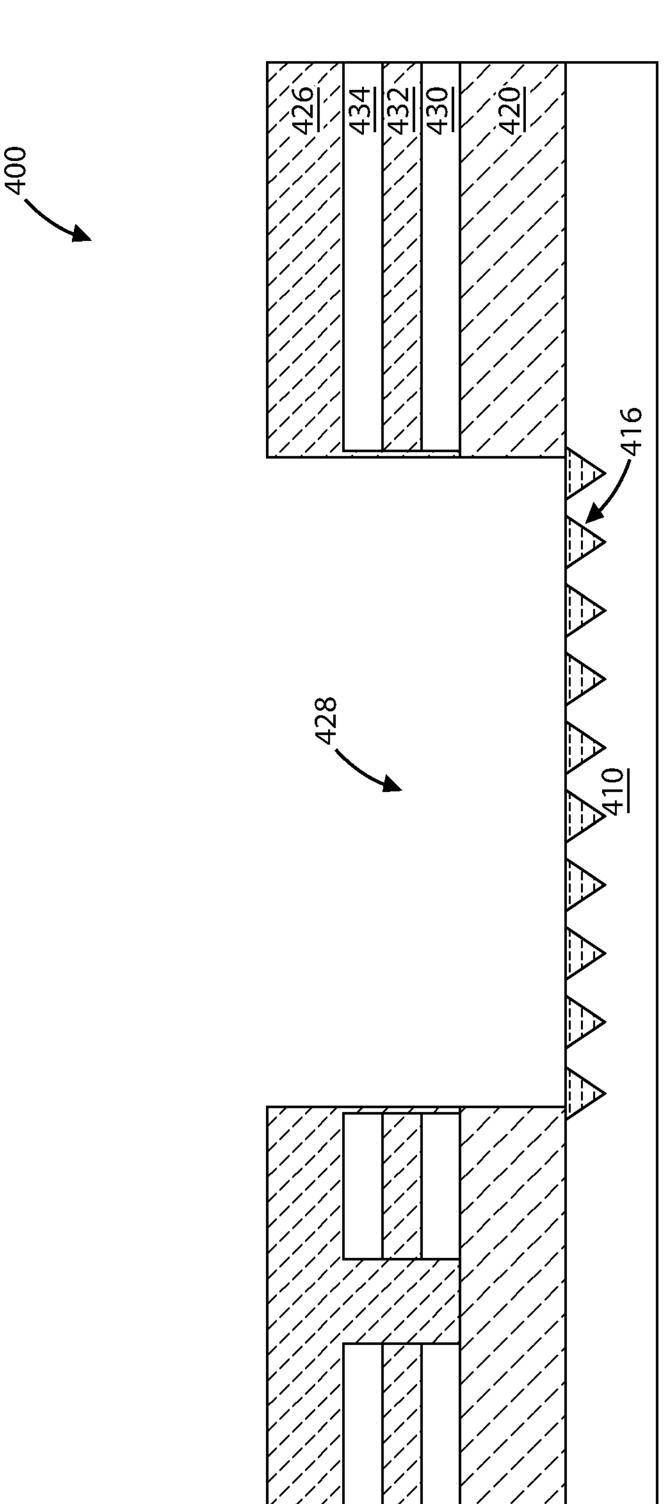

In FIG. 4F, the method includes removing the portions of the first and second insulating layers 420, 426 to form a cavity region 428. Here, the cavity region 428 is configured between the waveguide structures and extends through the first and second insulating layers 420, 426 and exposes the substrate 410 and the plurality of v-grooves 416. The method can also include subsequent surface preparation process, which can suppress or eliminate the formation of antiphase boundaries (APBs) or antiphase domains (APDs). Such processes can include an offcut Si process, surface roughening process, surface reordering process, or the like.

Figure 4G:
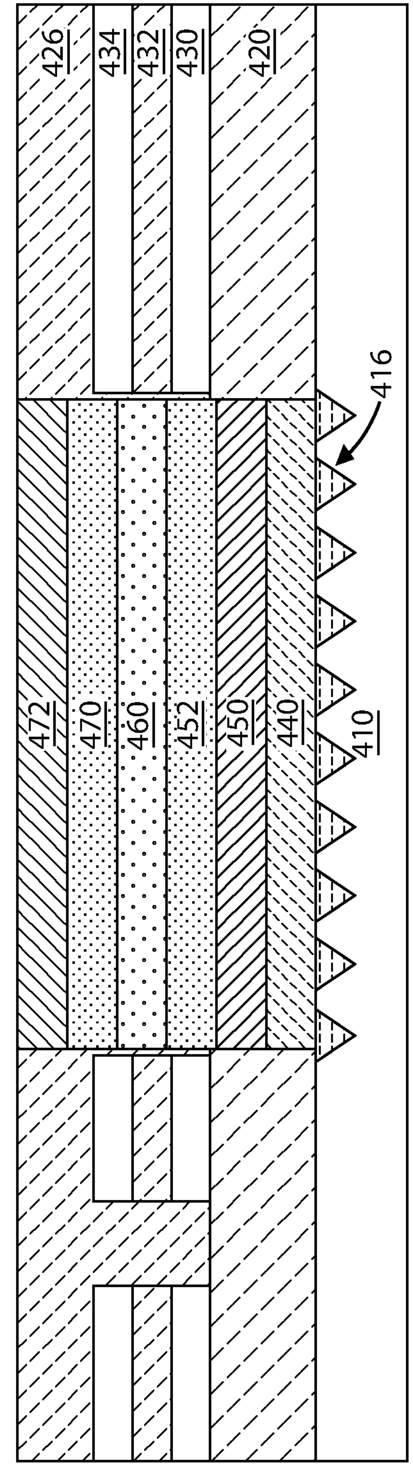

In FIG. 4G, the method includes forming a plurality of device layers within the cavity region 428. Here, the layers, from bottom to top, include a buffer material 440, an n-type contact material 450, an n-type lower cladding material 452, an active material 460, a p-type upper cladding material 470, and a p-type contact material 472. In a specific example, these materials can be deposited using a SAH process to form a laser device (e.g., III-V laser, or the like). The active material 460 can include a quantum well (QW) material, a quantum dot (QD) material, a quantum dash (QDash) material, or the like. Further, the active material 460 is spatially configured such that at least a portion of the active material 460 is aligned to the waveguide structures. The gap between the device layers and the waveguide structures can be controlled during the previous process steps, such as during the formation of the waveguide structure and the cavity region 428. These components can include similar materials and configurations discussed previously.

FIG. 5A to FIG. 5F are simplified diagrams illustrating cross-sectional views of a method of fabricating an active photonic device with embedded multi-layer waveguides and according to an example of the present invention. In these figures, shared reference numerals in subsequent figures refer to the same elements as described in previous figures. Further, these figures describe an alternative method following the step shown in FIG. 4C. Of course, there can be other variations, modifications, and alternatives to this method and resulting device configuration.

Figure 5A:
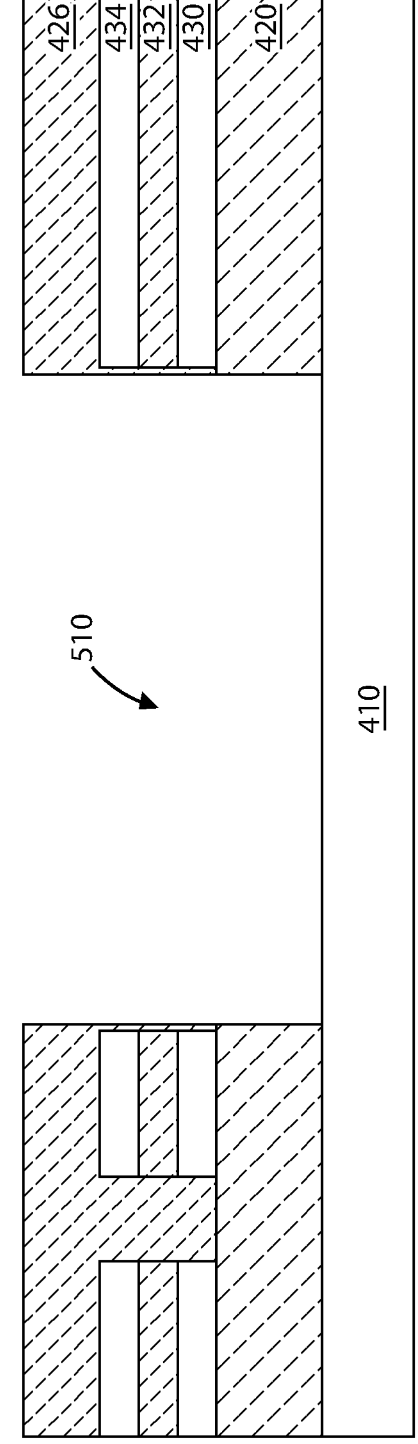
FIG. 5A to FIG. 5F are simplified diagrams illustrating cross-sectional views of a method of fabricating an active photonic device with embedded multi-layer waveguides and according to an example of the present invention.

In FIG. 5A, the method includes removing one or more portions of the second dielectric layer 426 and the first insulating layer 420 to form a cavity region 510, each of which exposes a portion of the substrate 410. Compared to the method shown in FIGS. 4D-4G, this method does not require high aspect ratio etching.

Figure 5B:
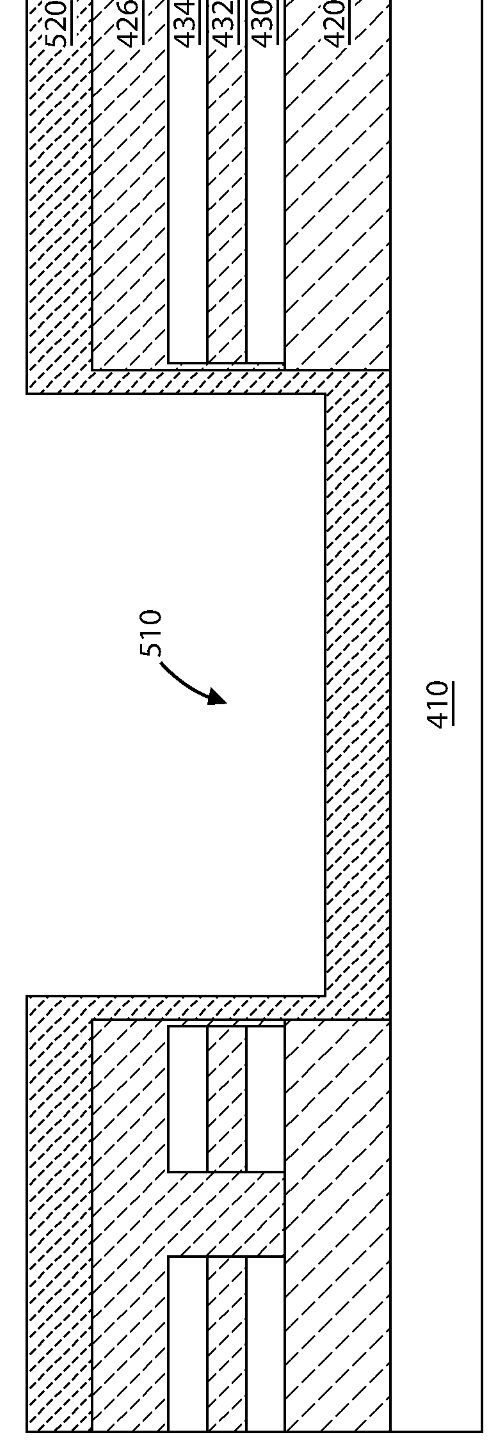
Figure 5C:
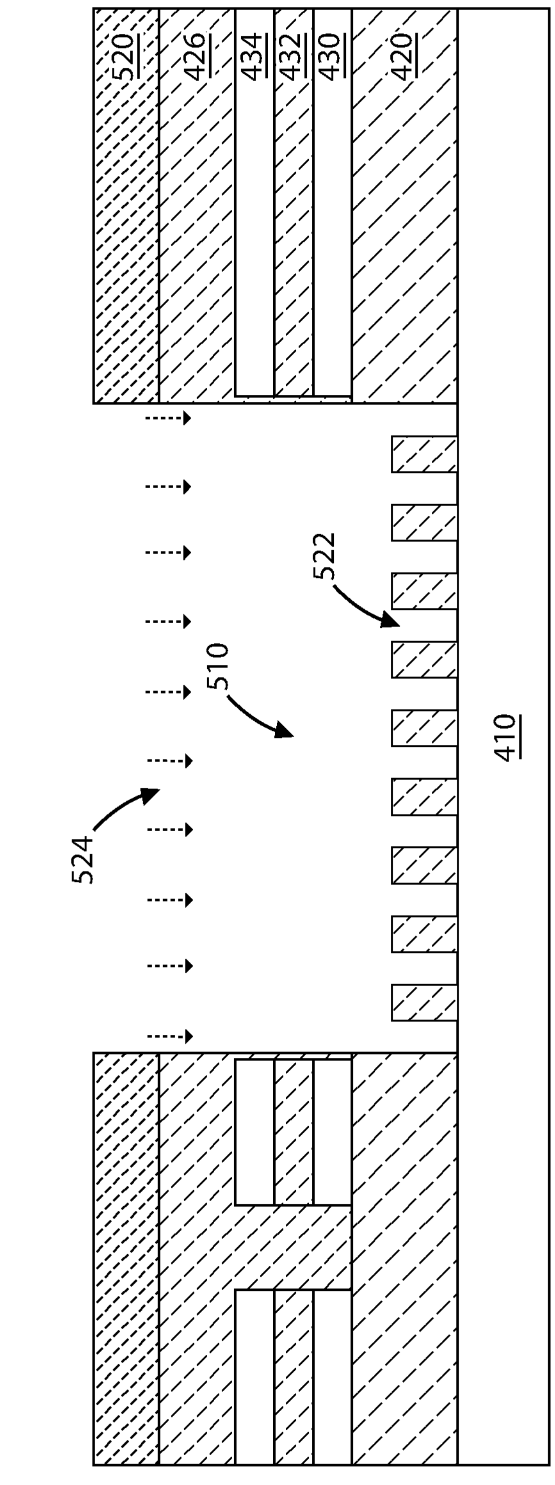
Figure 5D:
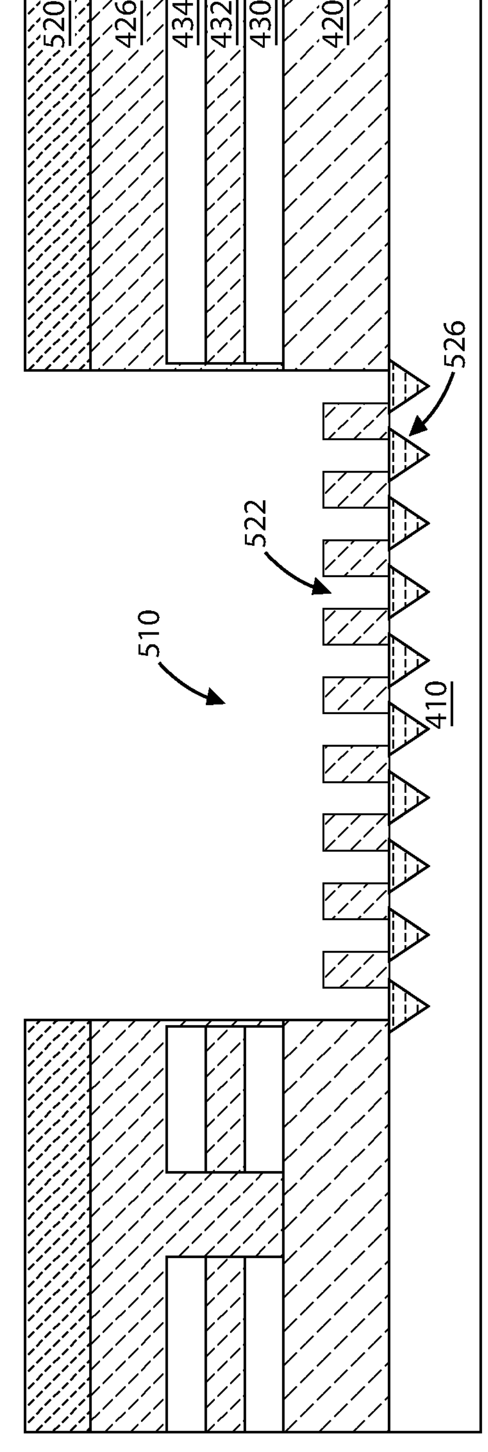

In FIG. 5B, the method includes forming a hard mask layer 520 (e.g., oxide material, low-x dielectric, and the like) overlying the second insulating layer 426 and the cavity region 510. Then, in FIG. 5C, the method includes removing one or more portions of the hard mask layer 520 to form a plurality of trenches 522, each of which exposes a portion of the substrate 410. Further, the method includes performing an etching process 524 to form a plurality of v-grooves 526 (see FIG. 5D) using the plurality of trenches 522. In a specific example, each of these v-grooves 526 can have a feature size of 30 to 500 nm in width, and each of these v-grooves can expose {111} crystalline planes of the substrate.

Figure 5E:
Figure 5E:
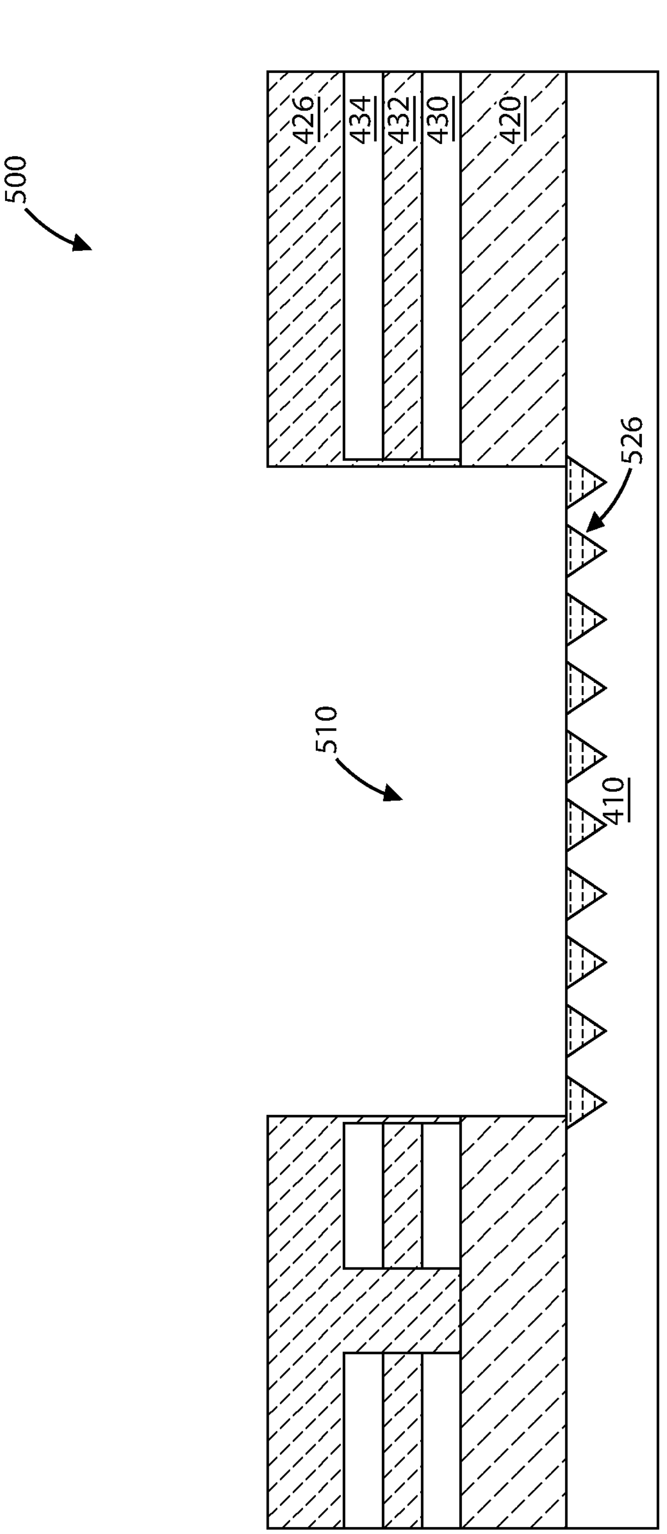

In FIG. 5E, the method includes removing the hard mask layer 520, which can include a hard mask layer etching process, or the like. The method can also include subsequent surface preparation process, which can suppress or eliminate the formation of antiphase boundaries (APBs) or antiphase domains (APDs). Such processes can include an offcut Si process, surface roughening process, surface reordering process, or the like.

Figure 5F:
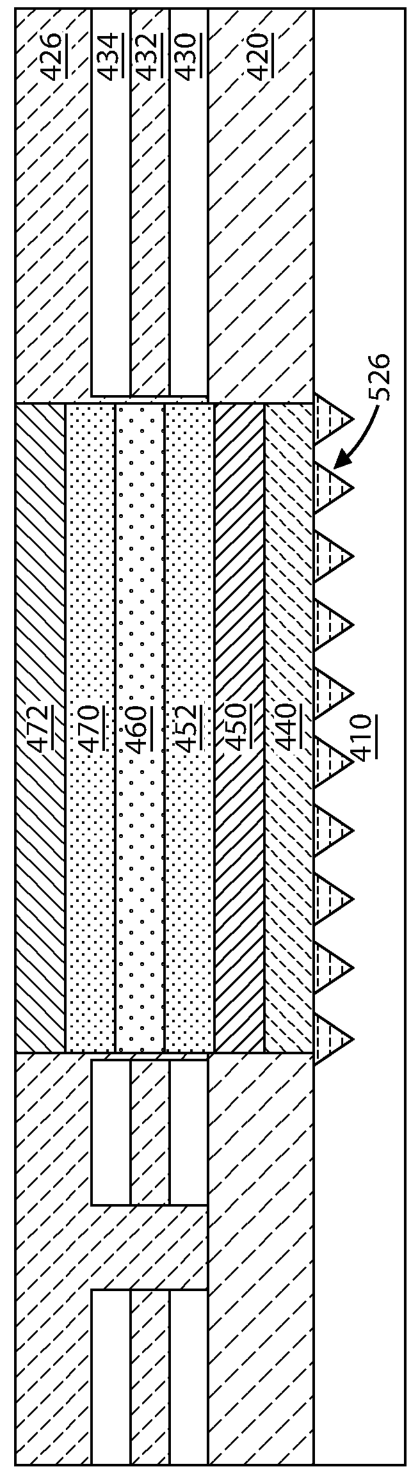

In FIG. 5F, the method includes forming a plurality of device layers within the cavity region 510. Here, the layers, from bottom to top, include a buffer material 440, an n-type contact material 450, an n-type lower cladding material 452, an active material 460, a p-type upper cladding material 470, and a p-type contact material 472. These components can include similar materials and configurations discussed previously.

FIG. 6A to FIG. 6J are simplified diagrams illustrating cross-sectional views of a method of fabricating an integrated system 600 including active photonic devices with embedded waveguides and according to an example of the present invention. In these figures, shared reference numerals in subsequent figures refer to the same elements as described in previous figures. Also, elements in these figures similar to those of previous figures can include similar material compositions and configurations as discussed previously. Of course, there can be other variations, modifications, and alternatives to this method and resulting device configuration.

Figure 6A:
FIG. 6A to FIG. 6J are simplified diagrams illustrating cross-sectional views of a method of fabricating an integrated system including active photonic devices with embedded waveguides and according to an example of the present invention.
Figure 6A:
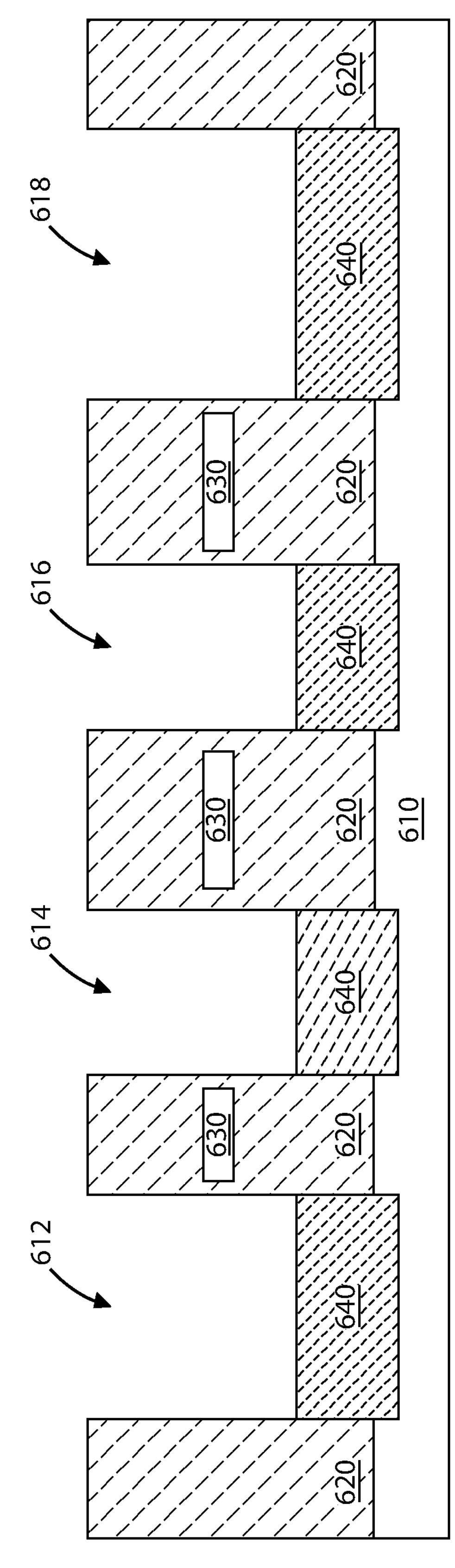

In FIG. 6A, the method includes providing a substrate 610, forming a first insulating layer 620 overlying the substrate 610, forming a plurality of trench/cavity regions 612, 614, 616, 618 within the first insulating layer 620, and forming a buffer material 640 overlying the substrate 610 within each of the trench regions 612. Although four trench regions are shown, the number can vary depending on the system requirements or particular application. In an example, the trench regions can expose portions of a surface region of the substrate 610 or the trench regions can extend within a portion of the substrate 610 (as shown in FIG. 6A). Further, the method can include forming one or more waveguide structures 630 within one or more portions of the insulating layer 620 between the trench regions 612.

Figure 6B:
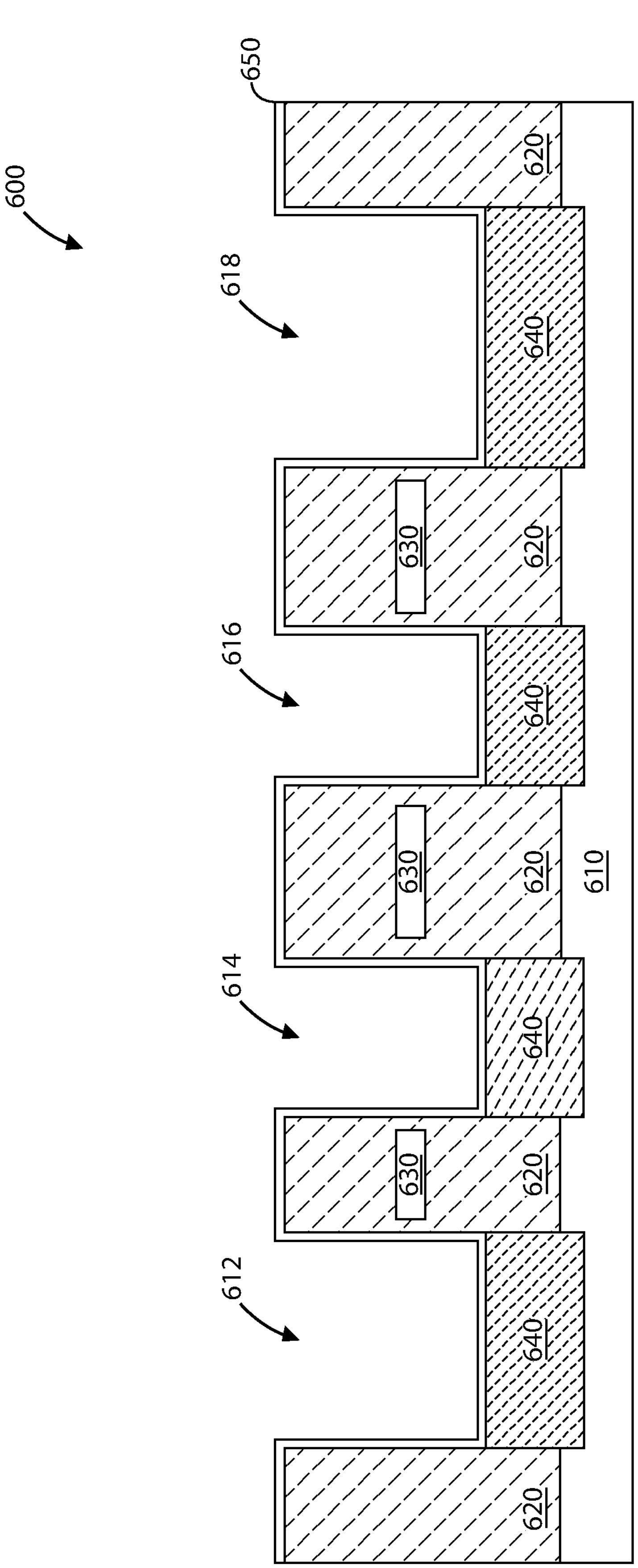
Figure 6C:
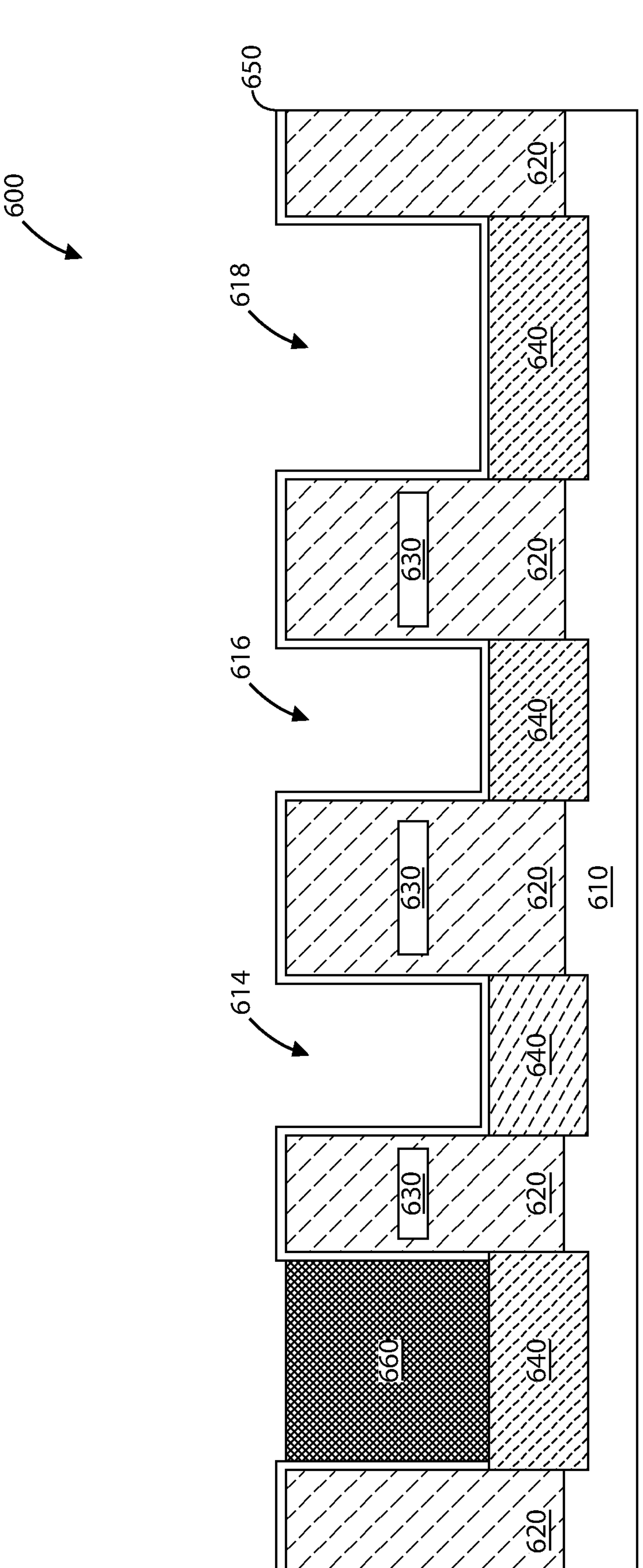

In FIG. 6B, the method includes forming a first thin insulating layer 650 overlying at least the first insulating layer 620, the plurality of trench regions 612, 614, 616, 618, and the buffer materials 640. Then, in FIG. 6C, the method includes removing a portion of the first thin insulating layer 650 overlying one of the trench regions to expose the buffer material 640 within that trench region (shown as trench region 612), and forming a first device 660 overlying the buffer material 640 using selective area heteroepitaxy (SAH). In a specific example, the first device 660 is a semiconductor laser device, or the like.

Figure 6D:
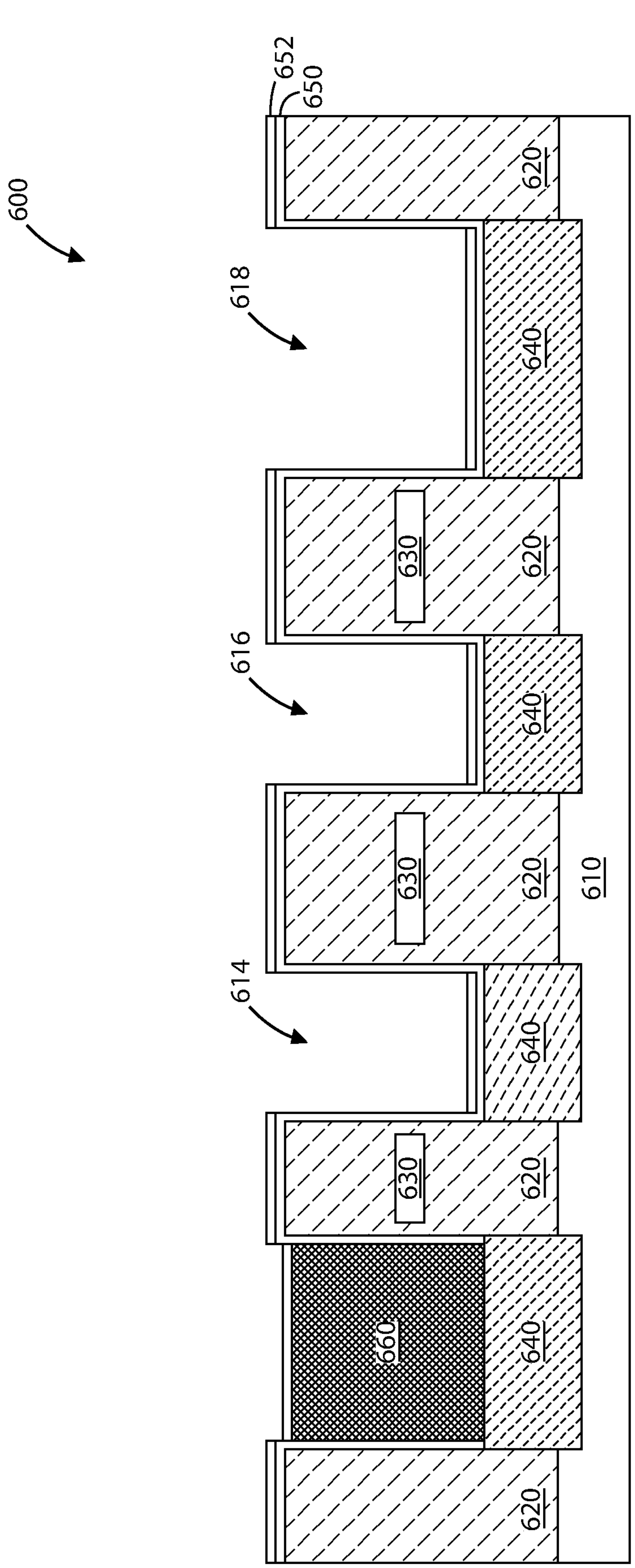
Figure 6E:
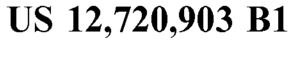
Figure 6E:
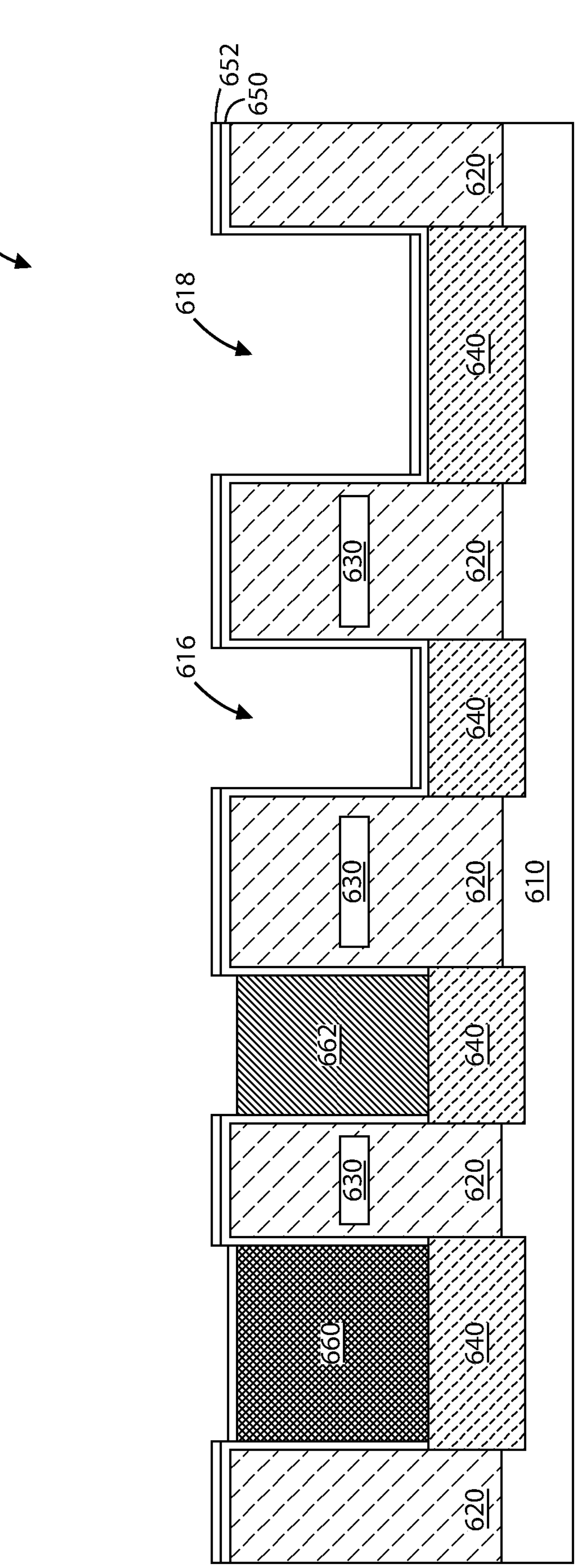

In FIG. 6D, the method includes forming a second thin insulating layer 652 overlying at least the first thin insulating layer 650 and the first device 660, and the remaining trench regions 614, 616, 618. Then, in FIG. 6E, the method includes removing portions of the second thin insulating layer 652 and the first thin insulating layer 650 overlying one of the remaining trench regions to expose the buffer material 640 within that trench region (shown as trench region 614), and forming a second device 662 overlying the buffer material 640 using SAH. In a specific example, the second device 662 is a semiconductor optical amplifier (SOA) device.

Figure 6F:
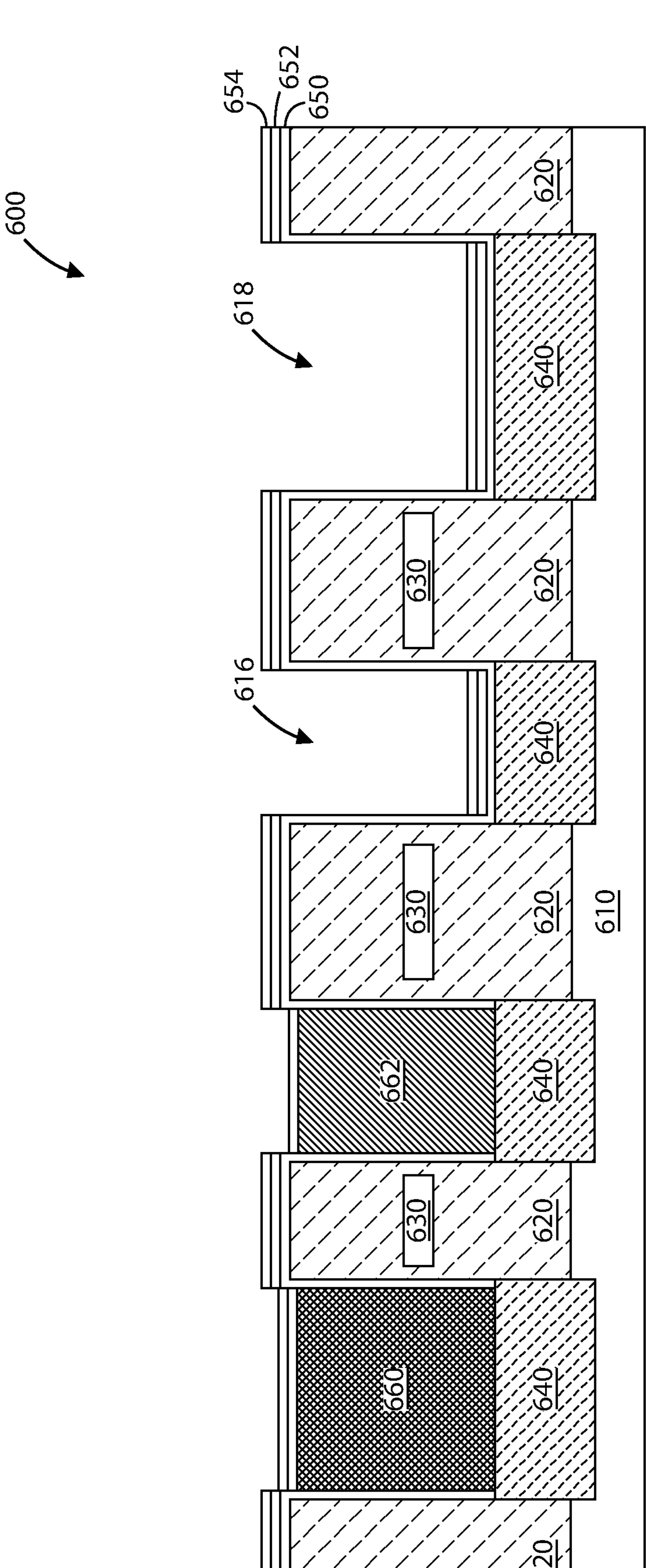
Figure 6G:
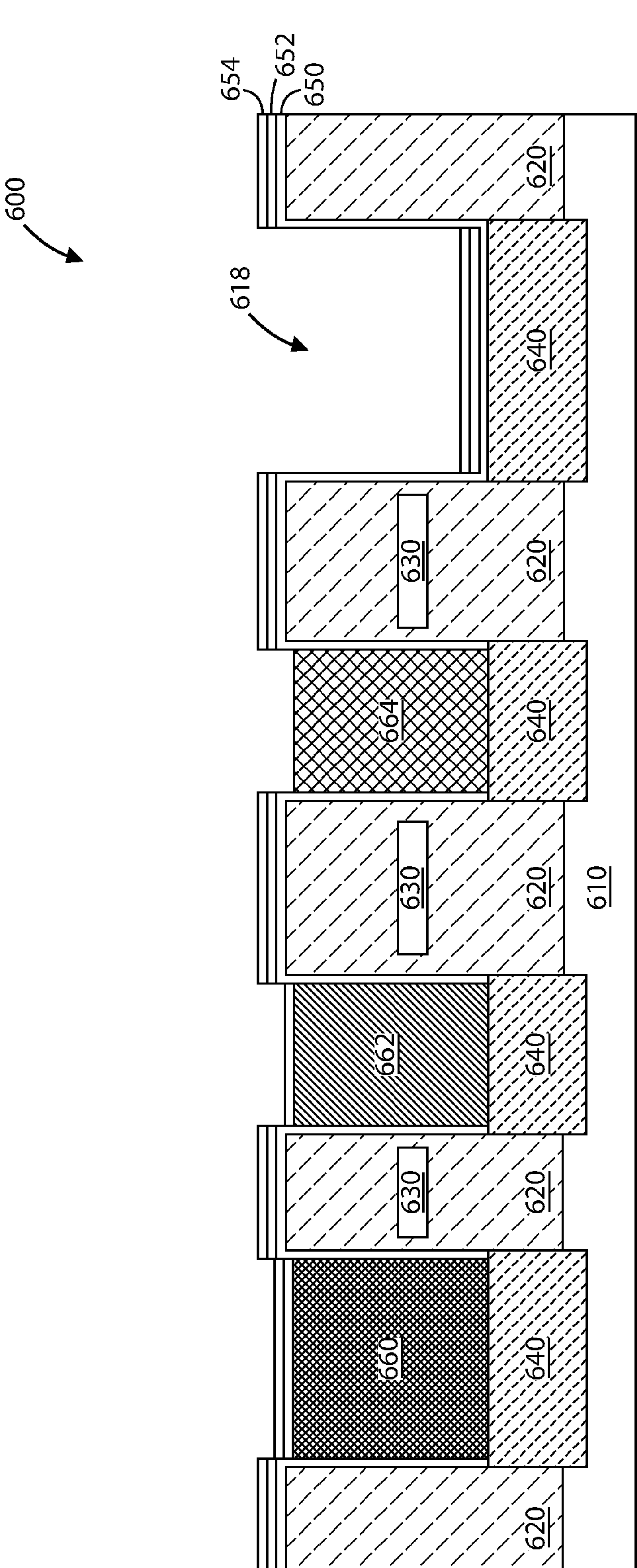

In FIG. 6F, the method includes forming a third thin insulating layer 654 overlying at least the second thin insulating layer 652, the second device 662, and the remaining trench regions 616, 618. Then, in FIG. 6G, the method includes removing a portion of the third thin insulating layer 654, the second thin insulating layer 652, and the first thin insulating layer 650 overlying one of the remaining trench regions to expose the buffer material within that trench region (shown as trench region 616), and forming a third device 664 overlying the buffer material 640 using SAH. In a specific example, the third device 664 is a QW modulator device.

Figure 6H:
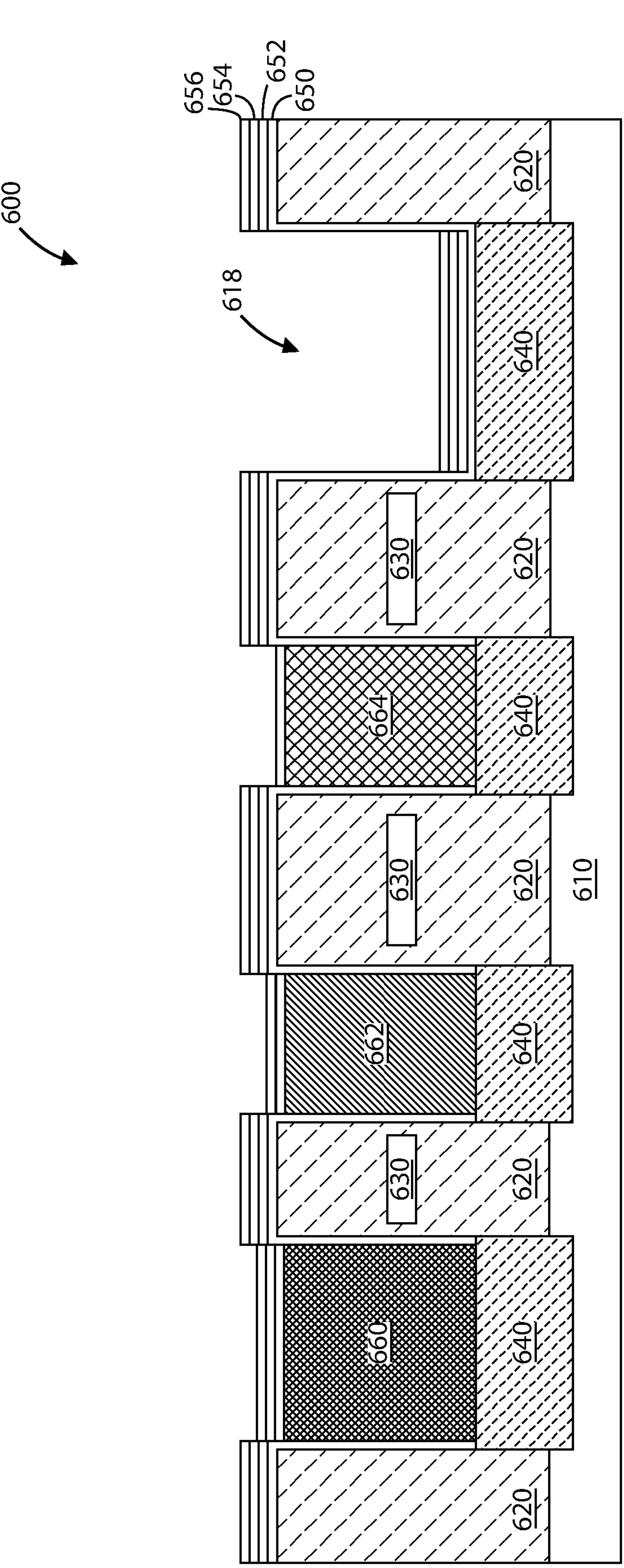
Figure 6I:
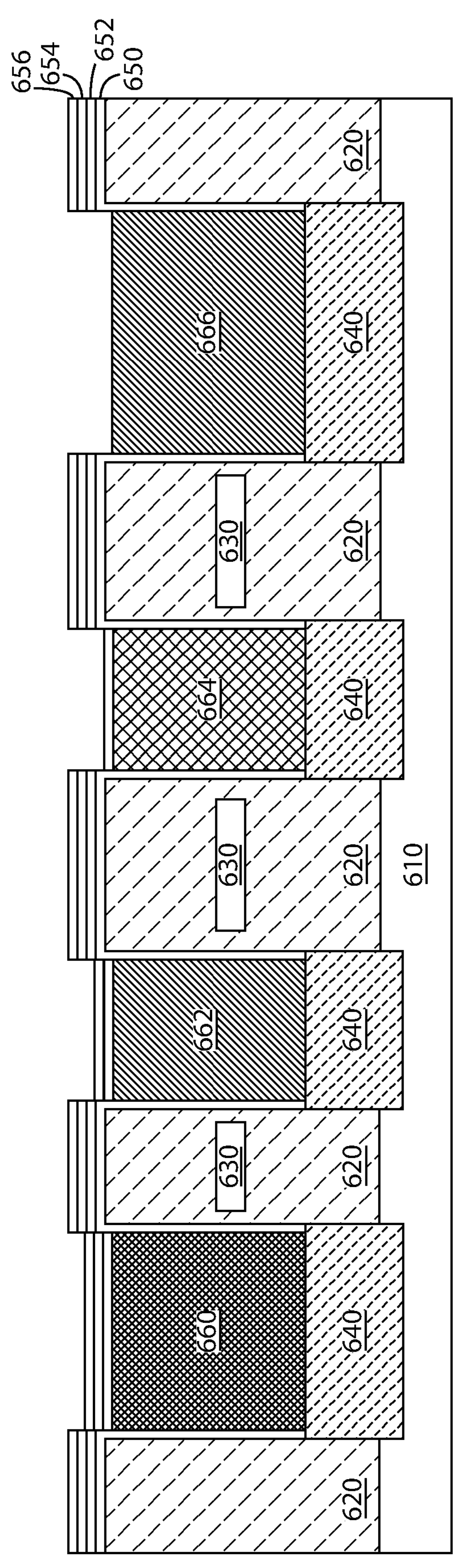

In FIG. 6H, the method includes forming a fourth thin insulating layer 656 overlying at least the third thin insulating layer 654, the third device 664, and the remaining trench region 618. Then, in FIG. 6I, the method includes removing a portion of the fourth thin insulating layer 656, the third thin insulating layer 654, the second thin insulating layer 652, and the first thin insulating layer 650 overlying the remaining trench region to expose the buffer material within that trench region (shown as trench region 618), and forming a fourth device 666 overlying the buffer material 640 using SAH. In a specific example, the fourth device 666 is a photodetector device.

Figure 6J:
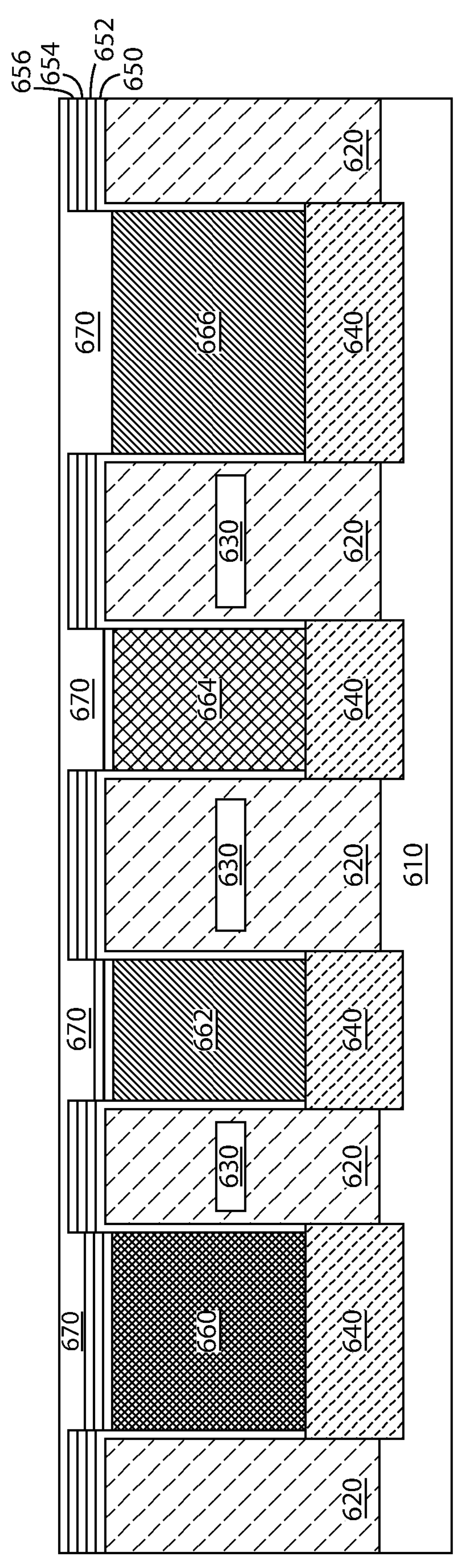

In FIG. 6J, the method includes forming a second insulating layer 670 overlying at least the fourth insulating layer 656 and the fourth device 666, and planarizing the second insulating layer 670. Afterwards, the method can include subsequent device and photonic integrated circuit (PIC) processes. Depending on the embodiment, the system 600 can integrate different kinds and numbers of active photonic devices.

Figure 7:
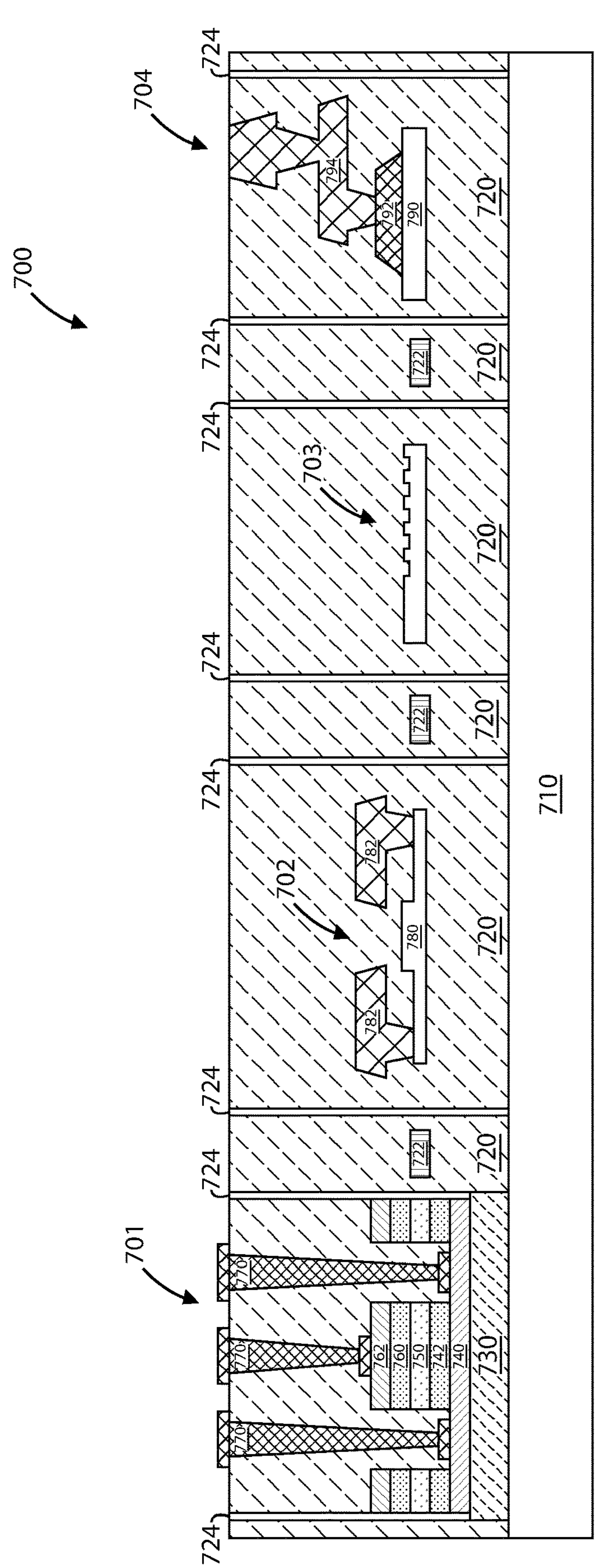
FIG. 7 is a simplified diagram illustrating a cross-section view of an integrated system with active photonic devices according to an example of the present invention.

FIG. 7 is a simplified diagram illustrating a cross-section view of an integrated system 700 with active photonic devices according to an example of the present invention. As shown, system 700 is configured similarly to system 600 with four devices (701, 702, 703, 704) integrated on a substrate 710 with an overlying insulating layer 720. Each of the devices is configured in a device region separated by thin insulating layers 724 and device 701 is also configured overlying a buffer material 730 formed overlying the substrate 710. These device regions can be formed using techniques similar to those discussed for FIGS. 6A to 6J. Further, system 700 includes waveguide structures 722 within portions of the insulating material 720 between the device regions.

In an example, device 701 is formed using selective area heteroepitaxy (SAH) and the techniques discussed previously, while the remaining devices 702-704 can be formed by conventional device fabrication techniques. Device 701 includes an active photonics device such as laser and/or SOA, which can be configured similarly to the previous active photonics devices. Here, overlying the buffer material 730, the device 701 includes the following stacked materials: an n-type contact material 740, an n-type lower cladding material 742, an active material 750, a p-type upper cladding material 760, a p-type contact material 762. And, contact structures 770 are configured within portions of the insulating layer 720 and coupled to the n-type contact material 740 and the p-type contact material 762.

Device 702 can include a modulator device, a rib waveguide device, or the like. Here, device 702 includes at least a waveguide portion 780 coupled to metal portions 782. Device 703 can include a grating coupler, or the like. And, device 704 can include a photodetector (e.g., Ge/Si photodetector), which can include at least a substrate portion 790, a device material 792, and metal portions 794. Further, these devices can be coupled in a butt-coupling scheme, in a directional coupling scheme, or the like. Here, the active material 750 of device 701 is vertically aligned to the waveguides 722, which are also aligned to a portion of each of the other devices 702, 703, and 704.

Depending on the application, the system 700 can integrate different kinds and numbers of devices (e.g., semiconductor optical amplifier, additional modulators, etc.) with the active photonic device 701. Those of ordinary skill in the art will recognize other variations, modifications, and alternatives.

FIG. 8A to FIG. 8D are simplified schematic diagrams illustrating various active photonic devices that can be fabricated and integrated with other devices according to examples of the present invention. These diagrams show various configurations of a gain device 810 having at least two outputs coupled to different filter devices. These configurations can be formed using selective area heteroepitaxy (SAH), as discussed previously.

Figure 8A:
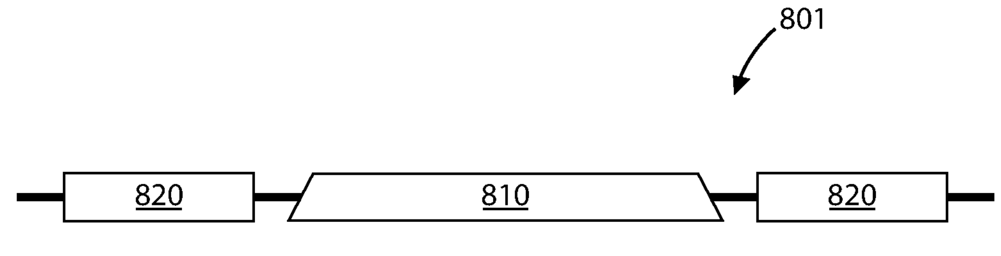
FIG. 8A to FIG. 8D are simplified schematic diagrams illustrating various active photonic devices that can be fabricated and integrated with other devices according to examples of the present invention.
Figure 8B:
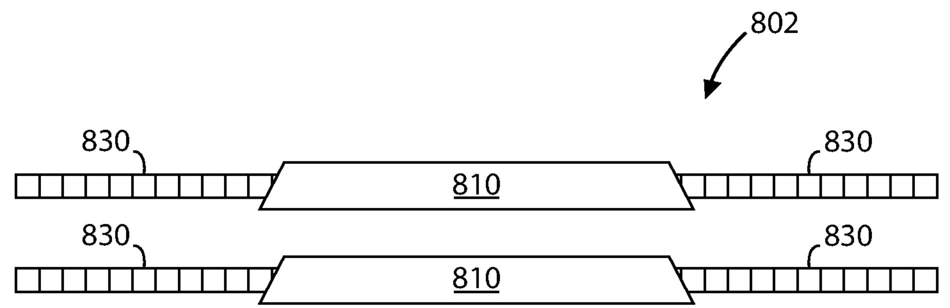
Figure 8C:
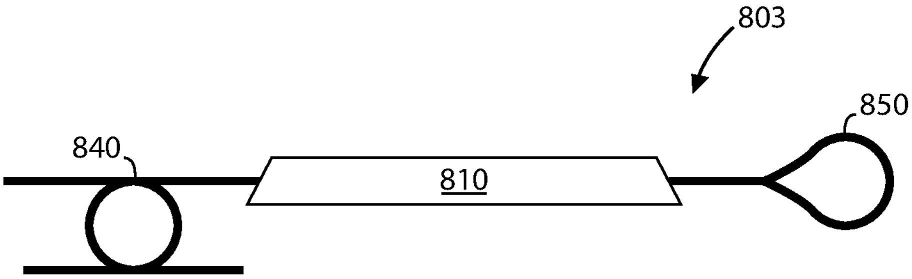
Figure 8D:
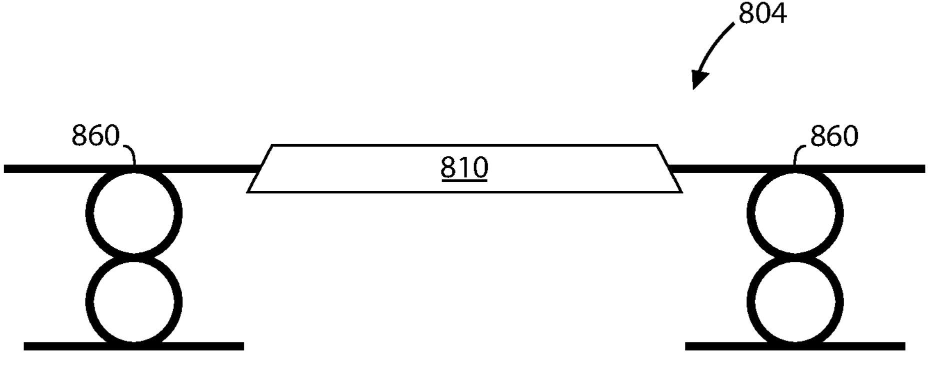

FIG. 8A shows the gain device 810 coupled to feedback/filter devices 820, while FIG. 8B shows a pair of gain devices 810, each coupled to a pair of distributed Bragg reflectors (DBRs) 830. FIG. 8C shows the gain device 810 coupled to a ring resonator device 840 on one end and coupled to a loop mirror 850 on the other end to form an external cavity. And FIG. 8D shows the gain device 810 with each output coupled to a cascaded ring resonator device 860 for light coupling.

With these methods of fabrication and integration, higher volume and scalability of the resulting devices and systems can be achieved (e.g., compared to conventional bonding techniques). The resulting devices and systems can include multi-wavelength transceivers for optical communications, monolithic LiDAR chips (e.g., FMCW transceivers with lasers), receivers on a single silicon photonics chip, and the like. Those of ordinary skill in the art will recognize other variations, modifications, and alternatives.

While the above is a full description of the specific embodiments, various modifications, alternative constructions, and equivalents may be used. As an example, the packaged device can include any combination of elements described above, as well as outside of the present specification. Therefore, the above description and illustrations should not be taken as limiting the scope of the present invention which is defined by the appended claims.

What is claimed is:

1. A method of fabricating an integrated system having a photonic integrated circuit (PIC) device, the method comprising:

providing a partially completed semiconductor wafer comprising a substrate, a first insulating layer overlying the substrate, and a device layer overlying the first insulating layer;

removing one or more portions of the device layer to form a plurality of waveguide structures overlying the first insulating layer;

forming a second insulating layer overlying the plurality of waveguide structures and the first insulating layer;

subjecting the second insulating layer to polishing process;

removing one or more portions of the second insulating layer, the first insulating layer, and the substrate to form a plurality of cavity regions, each exposing a recessed surfaced region of the substrate;

forming a thin conformal insulating layer overlying the second insulating layer and the cavity regions;

removing one or more portions of the thin conformal insulating layer overlying the second insulating material and the recessed surface regions of the substrate to form a sidewall spacer material within each cavity region;

subjecting the recessed surface regions of the substrate to a surface preparation process;

forming a buffer material overlying the recessed surface region within each cavity region;

forming an active photonic device within a first cavity region of the plurality of cavity regions, the forming of the active photonic device including forming a plurality of device materials within the first cavity region overlying the recessed surface region of the substrate within the first cavity region using a selective area heteroepitaxy (SAH) process, wherein forming the plurality of device materials comprises forming an n-type contact material overlying the buffer material within the first cavity region;

forming an n-type lower cladding material overlying the n-type contact material;

forming an active region material overlying the n-type cladding material, wherein the active region material is aligned with at least a portion of the plurality of waveguide structures;

forming a p-type upper cladding material overlying the active region material; and forming a p-type contact material overlying the p-type upper cladding material;

forming a photonic device in each of the remaining cavity regions using an SAH process; wherein forming each such photonic device includes forming a second thin insulating layer overlying the plurality of cavity regions and all previously formed photonic devices, removing a portion of the second thin insulating layer within a target cavity region, and forming one or more photonic device materials overlying the buffer material within the target cavity region using an SAH process;

forming a third insulating layer overlying the plurality of cavity regions, the active photonic device, the photonic devices, and the second thin insulating layers; and planarizing the third insulating layer.

2. The method of claim 1 wherein the partially completed semiconductor wafer comprises a silicon-on-insulator substrate, the substrate comprises a miscut oriented silicon substrate, and the plurality of waveguide structures comprises a plurality of silicon waveguide structures.

3. The method of claim 1 wherein the partially completed semiconductor wafer comprises a silicon nitride platform substrate and the plurality of waveguide structures comprises a plurality of silicon nitride waveguide structures.

4. The method of claim 1 wherein removing one or more portions of the device layer comprises first lithography process; wherein removing one or more portions of the second insulating layer, the first insulating layer, and the substrate to form the plurality of cavity regions comprises a second lithography process; and wherein removing one or more portions of the thin conformal insulating layer comprises a blanket etching process.

5. The method of claim 1 wherein each of the first insulating layer, the second insulating layer, the thin conformal insulating layer, the second thin insulating layers, and the third insulating layer comprises an oxide material or other dielectric material.

6. The method of claim 1 wherein subjecting the recessed surface regions of the substrate to a surface preparation process comprises an offcut process, a surface roughening process, or a surface reordering process.

7. The method of claim 1 wherein the plurality of device materials forms an optical device or a laser device; and wherein at least one of the plurality of device materials includes a compound semiconductor (CS) material selected from indium phosphide (InP), indium gallium arsenide (InGaAs), gallium arsenide (GaAs), gallium phosphide (GaP), indium gallium arsenide phosphide (InGaAsP), indium aluminum gallium arsenide (InAlGaAs), indium aluminum arsenide (InAlAs), indium arsenide (InAs), indium gallium phosphide (InGaP), or a combination thereof.

8. The method of claim 1 wherein the plurality of device materials is formed such that one or more of the plurality of waveguide structures are coupled to the plurality of device materials.

9. The method of claim 1 wherein the first cavity region is formed such that the formation of the plurality of device materials results in an interface region being configured between at least one of the plurality of waveguide structures and the plurality of device materials, the interface region being at least a portion of the first insulating layer or the second insulating layer.

10. The method of claim 1 wherein the plurality of cavity regions includes at least four cavity regions; wherein the active photonics device includes a laser device; wherein the photonic devices formed in the remaining cavity regions includes a modulator device, a semiconductor optical amplifier (SOA) device, and a photodetector device; and wherein the active photonics device and the photonic devices are configured in a butt-coupling scheme or a directional coupling scheme.

11. A method of fabricating an integrated system having a photonic integrated circuit (PIC) device, the method comprising:

providing a substrate;

forming a first insulating layer overlying the substrate;

removing a plurality of portions from the first insulating layer to form a plurality of trenches, each of which exposes a portion of the substrate, removing a plurality of portions from the substrate to form a plurality of v-grooves within the substrate using the plurality of trenches;

removing the remaining portions of the first insulating layer;

forming a second insulating layer overlying the substrate;

forming a multi-layer device stack overlying the second insulating layer, the multi-layer device stack having at least a first device layer overlying the second insulating layer, a first device cladding layer overlying the first device layer, and a second device layer overlying the first cladding layer;

removing one or more portions of the multi-layer device stack to form a plurality of waveguide structures overlying the second insulating layer;

forming a third insulating layer overlying the plurality of waveguide structures and the second insulating layer;

removing one or more portions of the third insulating layer and the second insulating layer to form a plurality of cavity regions, each exposing a surface region of the substrate;

forming a buffer material overlying the exposed surface region of the substrate within each cavity region;

forming an active photonic device within a first cavity region of the plurality of cavity regions, the forming of the active photonic device including forming a plurality of device materials within the first cavity region overlying the surface region of the substrate within the first cavity region using a selective area heteroepitaxy (SAH) process, wherein forming the plurality of device materials comprises forming an n-type contact material overlying the buffer material within the first cavity region;

forming an n-type lower cladding material overlying the n-type contact material;

forming an active region material overlying the n-type cladding material, wherein the active region material is aligned with at least a portion of the plurality of waveguide structures;

forming a p-type upper cladding material overlying the active region material; and forming a p-type contact material overlying the p-type upper cladding material;

forming a photonic device in each of the remaining cavity regions using an SAH process; wherein forming each such photonic device includes forming a thin insulating layer overlying the plurality of cavity regions and all previously formed photonic devices, removing a portion of the thin insulating layer within a target cavity region, and forming one or more photonic device materials overlying the buffer material within the target cavity region using an SAH process;

forming a fourth insulating layer overlying the plurality of cavity regions, the active photonic device, the photonic devices, and the thin insulating layers; and planarizing the fourth insulating layer.

12. The method of claim 11 wherein the plurality of waveguide structures comprises a plurality of silicon waveguide structures or silicon nitride waveguide structures.

13. The method of claim 11 wherein removing one or more portions of the first insulating layer to form the plurality of trenches comprises a first lithography process; wherein removing one or more portions of the third insulating layer and the second insulating layer to form the plurality of cavity regions comprises a second lithography process; and wherein removing the remaining portions of the first insulating layer comprises a blanket etching process.

14. The method of claim 11 wherein each of the first insulating layer, the second insulating layer, the third insulating layer, the thin insulating layers, and the fourth insulating layer comprises an oxide material or other dielectric material.

15. The method of claim 11 wherein the plurality of device materials forms an optical device or a laser device; and wherein at least one of the plurality of device materials includes a compound semiconductor (CS) material selected from indium phosphide (InP), indium gallium arsenide (InGaAs), gallium arsenide (GaAs), gallium phosphide (GaP), indium gallium arsenide phosphide (InGaAsP), indium aluminum gallium arsenide (InAlGaAs), indium aluminum arsenide (InAlAs), indium arsenide (InAs), indium gallium phosphide (InGaP), or a combination thereof.

16. The method of claim 11 wherein the plurality of device materials is formed such that one or more of the plurality of waveguide structures are coupled to the plurality of device materials.

17. The method of claim 11 wherein the plurality of device materials is formed such that an interface region is configured between at least one of the plurality of waveguide structures and the plurality of device materials, the interface region being at least a portion of the second insulating layer or the third insulating layer.

18. The method of claim 11 wherein the plurality of cavity regions includes at least four cavity regions; wherein the active photonics device includes a laser device; wherein the photonic devices formed in the remaining cavity regions includes a modulator device, a semiconductor optical amplifier (SOA) device, and a photodetector device; and wherein the active photonics device and the photonic devices are configured in a butt-coupling scheme or a directional coupling scheme.

19. A method of fabricating an integrated system having a photonic integrated circuit (PIC) device, the method comprising:

providing a substrate;

forming a first insulating layer overlying the substrate;

forming a multi-layer device stack overlying the second insulating layer, the multi-layer device stack having at least a first device layer overlying the second insulating layer, a first device cladding layer overlying the first device layer, and a second device layer overlying the first cladding layer;

removing one or more portions of the multi-layer device stack to form a plurality of waveguide structures overlying the first insulating layer;

forming a second insulating layer overlying the plurality of waveguide structures and the first insulating layer;

removing a first plurality of portions from the second insulating layer and the first insulating layer using a high aspect ratio etching process to form a plurality of trenches, each of the trenches exposing a portion of a surface region of the substrate;

removing a plurality of portions from the substrate to form a plurality of v-grooves within the substrate using the plurality of trenches;

removing a second plurality of portions from the second insulating layer and the first insulating layer to form a plurality of cavity regions, each exposing the surface region of the substrate;

forming a buffer material overlying the exposed surface region of the substrate within each cavity region;

forming an active photonic device within a first cavity region of the plurality of cavity regions, the forming of the active photonic device including forming a plurality of device materials within the first cavity region overlying the surface region of the substrate within the first cavity region using a selective area heteroepitaxy (SAH) process, wherein forming the plurality of device materials comprises forming an n-type contact material overlying the buffer material within the first cavity region;

forming an n-type lower cladding material overlying the n-type contact material;

forming an active region material overlying the n-type cladding material, wherein the active region material is aligned with at least a portion of the plurality of waveguide structures;

forming a p-type upper cladding material overlying the active region material; and forming a p-type contact material overlying the p-type upper cladding material;

forming a photonic device in each of the remaining cavity regions using an SAH process; wherein forming each such photonic device includes forming a thin insulating layer overlying the plurality of cavity regions and all previously formed photonic devices, removing a portion of the thin insulating layer within a target cavity region, and forming one or more photonic device materials overlying the buffer material within the target cavity region using an SAH process;

forming a third insulating layer overlying the plurality of cavity regions, the active photonic device, the photonic devices, and the thin insulating layers; and planarizing the third insulating layer.

20. The method of claim 19 wherein the plurality of waveguide structures comprises a plurality of silicon waveguide structures or silicon nitride waveguide structures.

21. The method of claim 19 wherein removing the second plurality of portions from the second insulating layer and the first insulating layer to form the plurality of cavity 2 regions comprises a first lithography process.

22. The method of claim 19 wherein each of the first insulating layer, the second insulating layer, the thin insulating layers, and the third insulating layer comprises an oxide material or other dielectric material.

23. The method of claim 19 wherein the plurality of device materials forms an optical device or a laser device; and wherein at least one of the plurality of device materials includes a compound semiconductor (CS) material selected from indium phosphide (InP), indium gallium arsenide (InGaAs), gallium arsenide (GaAs), gallium phosphide (GaP), indium gallium arsenide phosphide (InGaAsP), indium aluminum gallium arsenide (InAlGaAs), indium aluminum arsenide (InAlAs), indium arsenide (InAs), indium gallium phosphide (InGaP), or a combination thereof.

24. The method of claim 19 wherein the plurality of device materials is formed such that one or more of the plurality of waveguide structures are coupled to the plurality of device materials.

25. The method of claim 19 wherein the plurality of device materials is formed such that an interface region is configured between at least one of the plurality of waveguide structures and the plurality of device materials, the interface region being at least a portion of the first insulating layer or the second insulating layer.

26. The method of claim 19 wherein the plurality of cavity regions includes at least four cavity regions; wherein the active photonics device includes a laser device; wherein the photonic devices formed in the remaining cavity regions includes a modulator device, a semiconductor optical amplifier (SOA) device, and a photodetector device; and wherein the active photonics device and the photonic devices are configured in a butt-coupling scheme or a directional coupling scheme.

27. A method of fabricating an integrated system having a photonic integrated circuit (PIC) device, the method comprising:

providing a substrate;

forming a first insulating layer overlying the substrate;

forming a multi-layer device stack overlying the second insulating layer, the multi-layer device stack having at least a first device layer overlying the second insulating layer, a first device cladding layer overlying the first device layer, and a second device layer overlying the first cladding layer;

removing one or more portions of the multi-layer device stack to form a plurality of waveguide structures overlying the first insulating layer;

forming a second insulating layer overlying the plurality of waveguide structures and the first insulating layer;

removing one or more portions from the second insulating layer and the first insulating layer to form a plurality of cavity regions, each exposing a surface region of the substrate;

forming a hard mask layer overlying the second insulating layer and the plurality of cavity regions;

removing a plurality of portions from the hard mask layer within a first cavity region of the plurality of cavity regions to form a plurality of trenches, each of which exposes a portion of a surface region of the substrate removing a plurality of portions from the substrate to form a plurality of v-grooves within the substrate in the first cavity region using the plurality of trenches;

removing the remaining portions of the hard mask layer;

forming a buffer material overlying the exposed surface region of the substrate within each cavity region;

forming an active photonic device within the first cavity region of the plurality of cavity regions, the forming of the active photonic device including forming a plurality of device materials within the first cavity region overlying the surface region of the substrate within the first cavity region using a selective area heteroepitaxy (SAH) process, wherein forming the plurality of device materials comprises forming an n-type contact material overlying the buffer material within the first cavity region;

forming an n-type lower cladding material overlying the n-type contact material;

forming an active region material overlying the n-type cladding material, wherein the active region material is aligned with at least a portion of the plurality of waveguide structures;

forming a p-type upper cladding material overlying the active region material; and forming a p-type contact material overlying the p-type upper cladding material;

forming a photonic device in each of the remaining cavity regions using an SAH process; wherein forming each such photonic device includes forming a thin insulating layer overlying the plurality of cavity regions and all previously formed photonic devices, removing a portion of the thin insulating layer within a target cavity region, and forming one or more photonic device materials overlying the buffer material within the target cavity region using an SAH process;

forming a third insulating layer overlying the plurality of cavity regions, the active photonic device, the photonic devices, and the thin insulating layers; and planarizing the third insulating layer.

28. The method of claim 27 wherein the plurality of waveguide structures comprises a plurality of silicon waveguide structures or silicon nitride waveguide structures.

29. The method of claim 27 wherein removing one or more portions from the second insulating layer and the first insulating layer to form the plurality of cavity regions comprises a first lithography process; and wherein removing the remaining portions of the hard mask layer comprises a blanket etching process.

30. The method of claim 27 wherein each of the first insulating layer, the second insulating layer, the thin insulating layers, the third insulating layer, and the hard mask layer comprises an oxide material or other dielectric material.

31. The method of claim 27 wherein the plurality of device materials forms an optical device or a laser device; and wherein at least one of the plurality of device materials includes a compound semiconductor (CS) material selected from indium phosphide (InP), indium gallium arsenide (InGaAs), gallium arsenide (GaAs), gallium phosphide (GaP), indium gallium arsenide phosphide (InGaAsP), indium aluminum gallium arsenide (InAlGaAs), indium aluminum arsenide (InAlAs), indium arsenide (InAs), indium gallium phosphide (InGaP), or a combination thereof.

32. The method of claim 27 wherein the plurality of device materials is formed such that one or more of the plurality of waveguide structures are coupled to the plurality of device materials.

33. The method of claim 27 wherein the plurality of device materials is formed such that an interface region of is configured between at least one of the plurality of waveguide structures and the plurality of device materials, the interface region being at least a portion of the first insulating layer or the second insulating layer.

34. The method of claim 27 wherein the plurality of cavity regions includes at least four cavity regions; wherein the active photonics device includes a laser device; wherein the photonic devices formed in the remaining cavity regions includes a modulator device, a semiconductor optical amplifier (SOA) device, and a photodetector device; and wherein the active photonics device and the photonic devices are configured in a butt-coupling scheme or a directional coupling scheme.

* * * * *